(12) United States Patent
Yu et al.

(10) Patent No.: US 9,502,627 B2
(45) Date of Patent: Nov. 22, 2016

(54) WAFER LEVEL PHOTONIC DEVICES DIES STRUCTURE AND METHOD OF MAKING THE SAME

(71) Applicant: EPISTAR CORPORATION, Hsinchu (TW)

(72) Inventors: Chih-Kuang Yu, Chiayi (TW); Hung-Yi Kuo, Taipei (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/981,239

(22) Filed: Dec. 28, 2015

(65) Prior Publication Data

US 2016/0118562 A1    Apr. 28, 2016

Related U.S. Application Data

(63) Continuation of application No. 14/096,420, filed on Dec. 4, 2013, now Pat. No. 9,224,932, which is a
(Continued)

(51) Int. Cl.
| | |
|---|---|
| H01L 33/38 | (2010.01) |
| H01L 33/62 | (2010.01) |
| H01L 33/00 | (2010.01) |
| H01L 33/06 | (2010.01) |
| H01L 33/08 | (2010.01) |
| H01L 33/40 | (2010.01) |
| H01L 33/22 | (2010.01) |

(Continued)

(52) U.S. Cl.
CPC ............ *H01L 33/62* (2013.01); *H01L 33/005* (2013.01); *H01L 33/0079* (2013.01); *H01L 33/06* (2013.01); *H01L 33/08* (2013.01); *H01L 33/22* (2013.01); *H01L 33/32* (2013.01); *H01L 33/382* (2013.01); *H01L 33/405* (2013.01); *H01L 33/502* (2013.01); *H01L 33/486* (2013.01); *H01L 2924/0002* (2013.01)

(58) Field of Classification Search
CPC ...................................................... H01L 33/382
USPC ..................................................... 257/98, 99
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |

(Continued)

*Primary Examiner* — George Fourson, III
(74) *Attorney, Agent, or Firm* — Muncy, Geissler, Olds & Lowe, P.C.

(57) ABSTRACT

A light-emitting device includes a first epi-structure with a top surface and a bottom surface opposite to the top surface, a first metal element and a second metal element disposed on the bottom surface, a first through-via, a conductive element disposed on the top surface, and a phosphor layer disposed on the top surface and covering the conductive element. The first epi-structure includes a first doped semiconductor layer, a second doped semiconductor layer closer to the bottom surface than the first doped semiconductor layer, and a light-emitting layer disposed between the first and second doped semiconductor layers. The first through-via extends through the first doped semiconductor layer and the second doped semiconductor layer and is electrically connected to the first doped semiconductor layer and the second metal element. The conductive element is in a configuration to expose a portion of the top surface, and electrically connected to the first through-via.

19 Claims, 30 Drawing Sheets

Related U.S. Application Data continuation of application No. 13/188,020, filed on Jul. 21, 2011, now Pat. No. 8,604,491.

(51) Int. Cl.
*H01L 33/32* (2010.01)
*H01L 33/50* (2010.01)
*H01L 33/48* (2010.01)

(56) References Cited

U.S. PATENT DOCUMENTS

| | | |
|---|---|---|
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine et al. |
| 6,664,129 B2 | 12/2003 | Siniaguine et al. |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 6,964,877 B2 | 11/2005 | Chen et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,901 B2 | 10/2006 | Sunohara et al. |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 8,012,778 B2 | 9/2011 | Kim et al. |
| 8,058,669 B2 | 11/2011 | Chen et al. |
| 8,183,578 B2 | 5/2012 | Wang |
| 8,236,584 B1 | 8/2012 | Chem et al. |
| 8,241,932 B1* | 8/2012 | Yu .............. H01L 25/0753 257/E21.122 |
| 8,450,751 B2 | 5/2013 | Engl et al. |
| 8,525,216 B2 | 9/2013 | Chen et al. |
| 2005/0104081 A1 | 5/2005 | Kim et al. |
| 2007/0023886 A1 | 2/2007 | Hedler et al. |
| 2007/0041214 A1 | 2/2007 | Ha et al. |
| 2008/0169548 A1 | 7/2008 | Baek |
| 2010/0051972 A1 | 3/2010 | Chen et al. |
| 2010/0252840 A1* | 10/2010 | Ibbetson .......... H01L 25/0753 257/88 |
| 2011/0198609 A1 | 8/2011 | Huang |
| 2012/0043563 A1* | 2/2012 | Ibbetson .......... H01L 25/0753 257/88 |
| 2012/0164797 A1* | 6/2012 | Lowenthal ........ H01L 27/3281 438/127 |
| 2012/0181568 A1* | 7/2012 | Hsia ................ H01L 33/0095 257/99 |
| 2012/0286240 A1 | 11/2012 | Yu et al. |
| 2013/0020589 A1* | 1/2013 | Yu ................... H01L 33/0079 257/88 |
| 2013/0264589 A1* | 10/2013 | Bergmann .......... H01L 33/62 257/88 |
| 2014/0084318 A1* | 3/2014 | Kim .................. H01L 33/62 257/98 |
| 2015/0243846 A1* | 8/2015 | Kwon ............... H01L 33/62 257/13 |
| 2015/0295154 A1* | 10/2015 | Tu .................... H01L 33/0079 438/27 |
| 2015/0364653 A1* | 12/2015 | Chae ................. H01L 33/405 257/98 |

\* cited by examiner

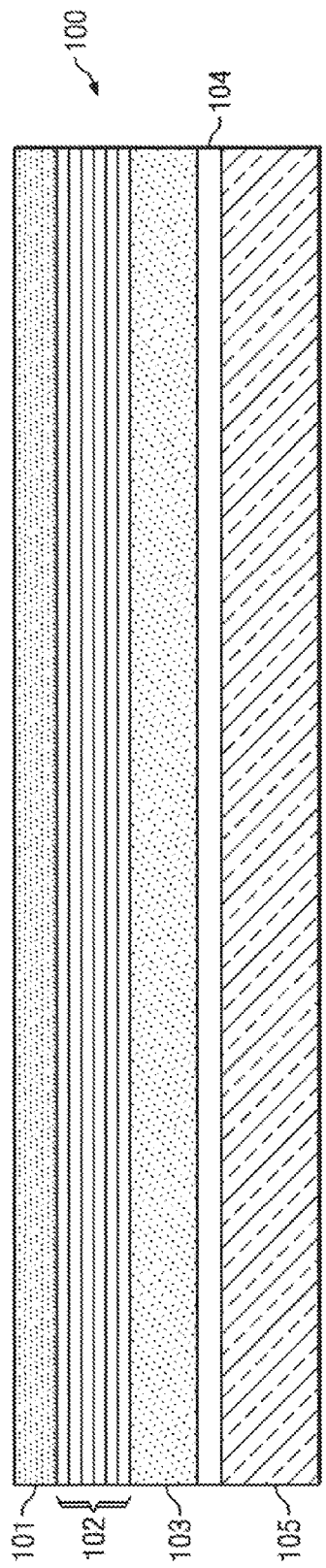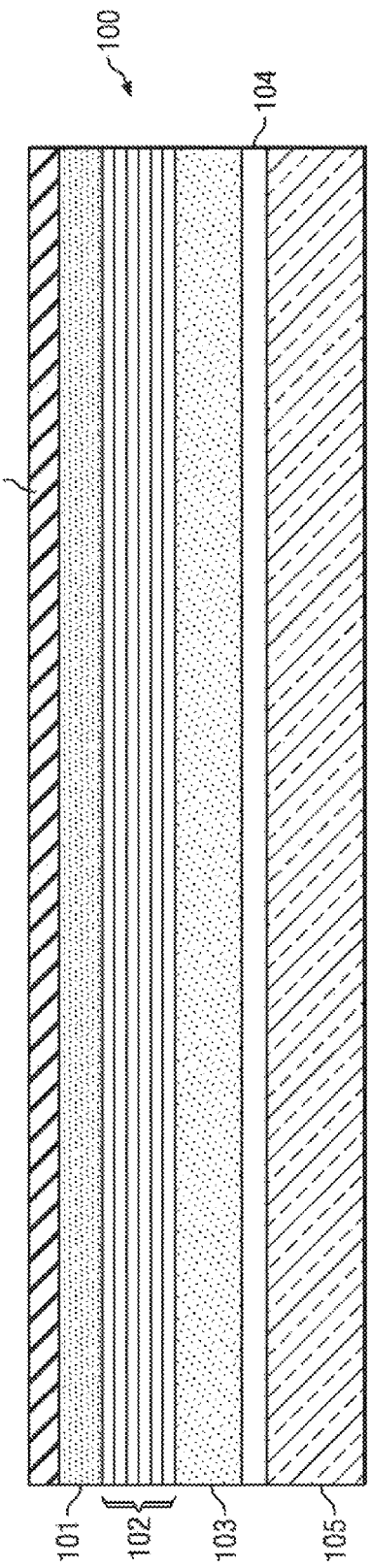

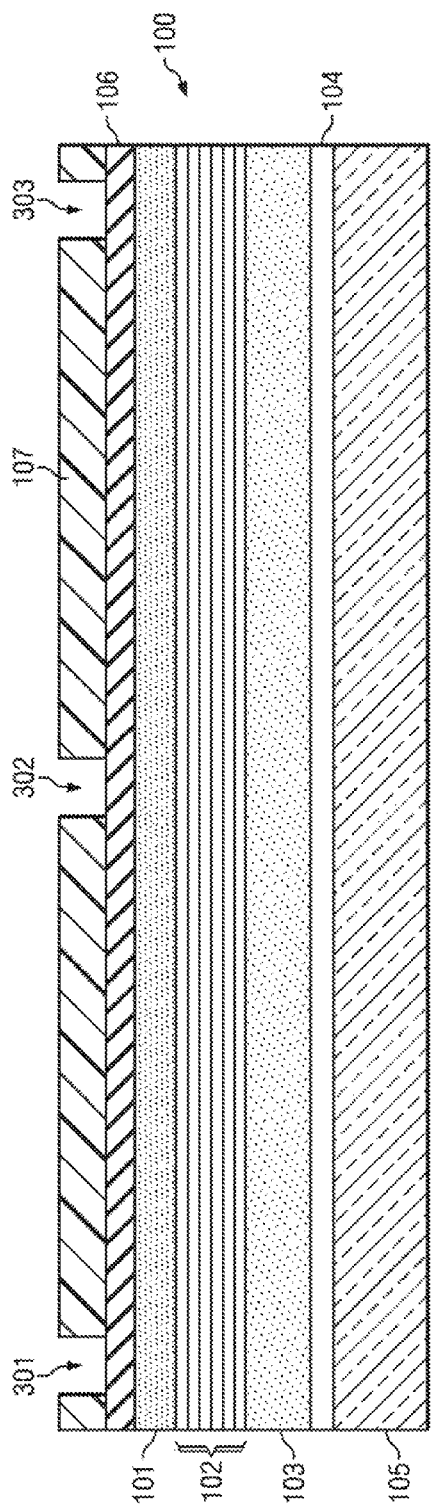
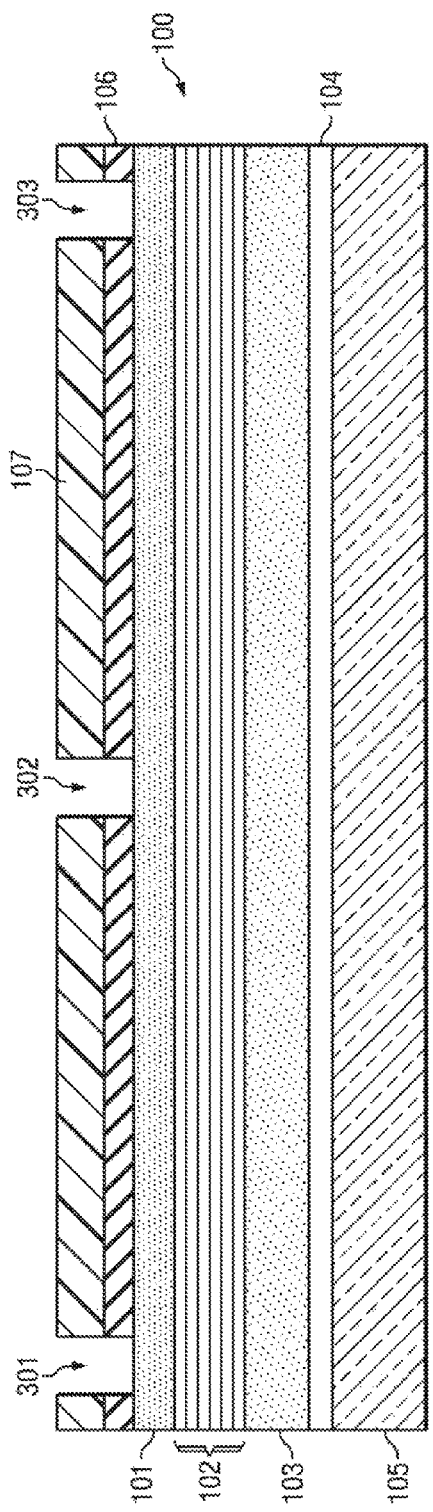
Fig. 3
Fig. 4

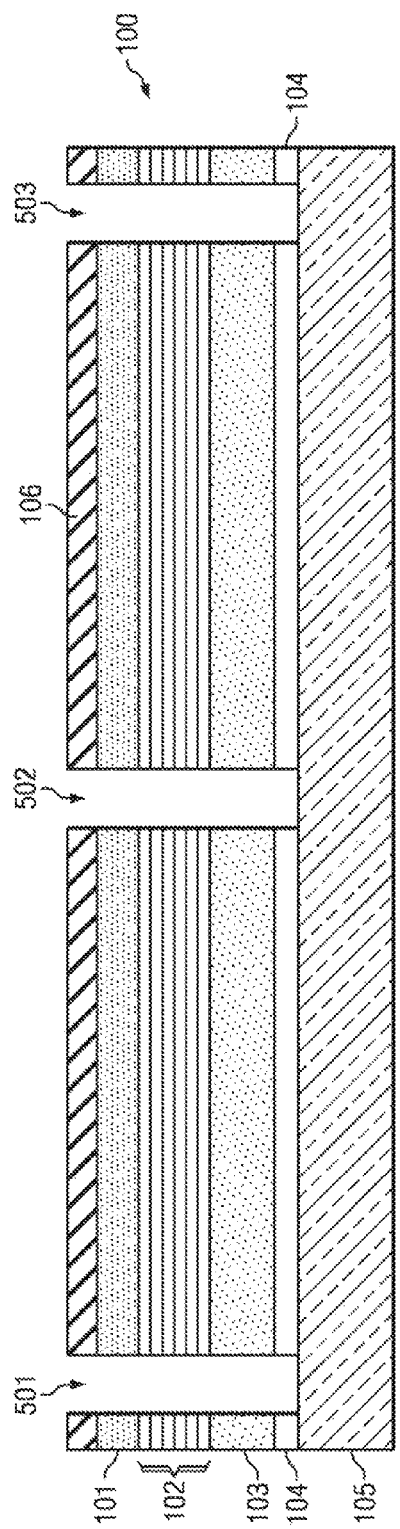
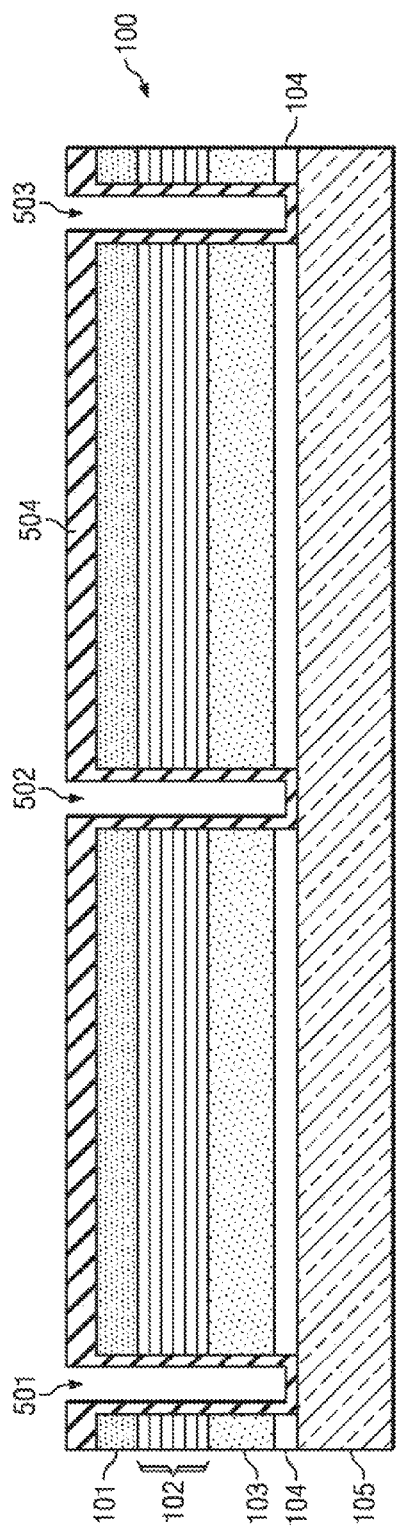
Fig. 5
Fig. 6

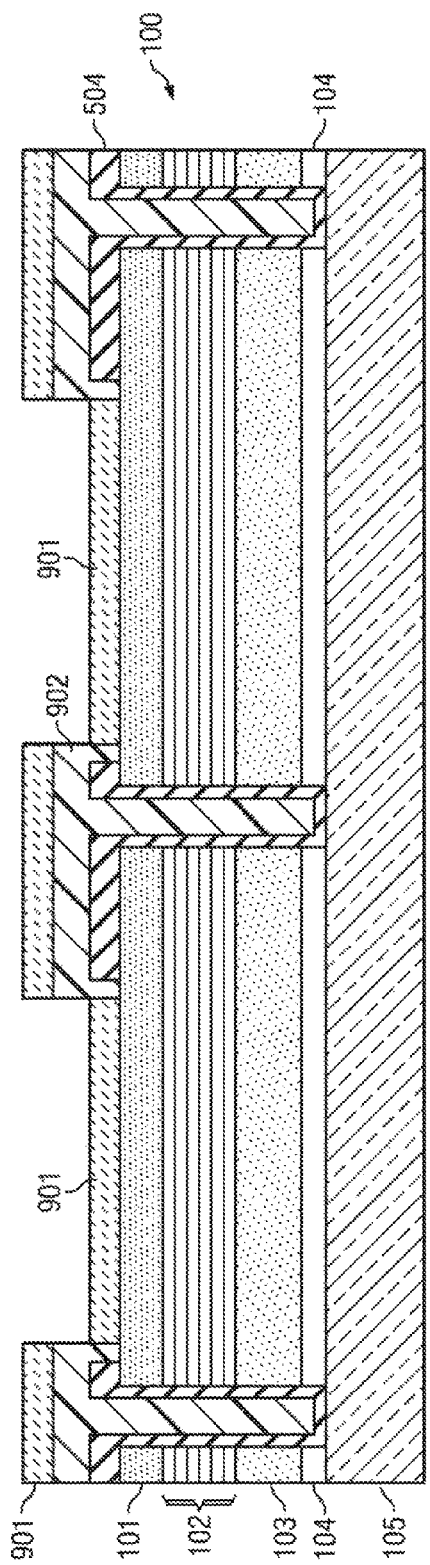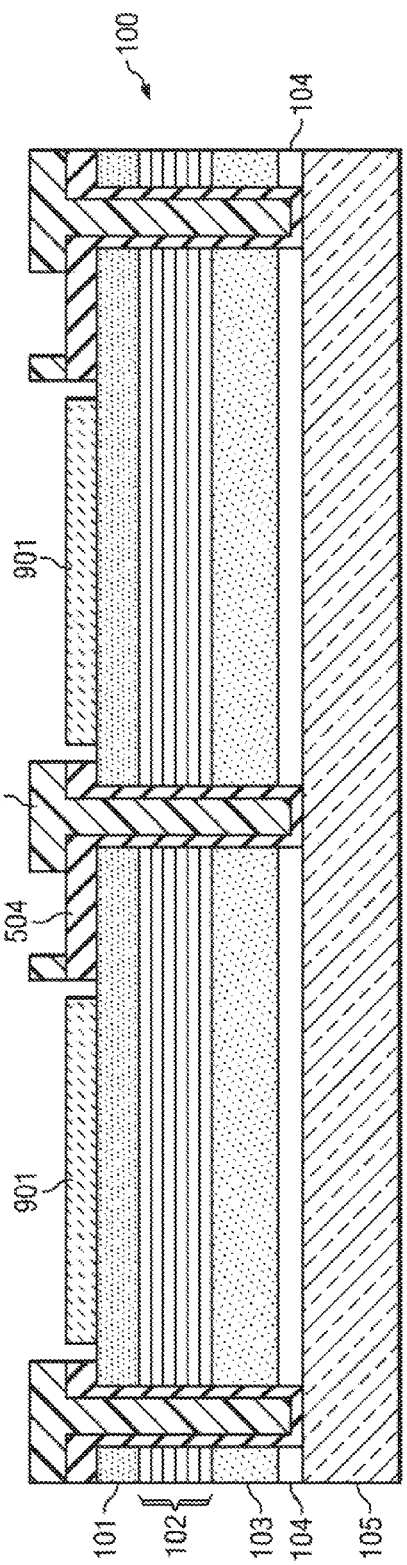
Fig. 9
Fig. 10

WAFER LEVEL PHOTONIC DEVICES DIES STRUCTURE AND METHOD OF MAKING THE SAME

CROSS REFERENCE TO RELATED APPLICATIONS

This application is a Continuation of co-pending application Ser. No. 14/096,420, filed on Dec. 4, 2013, which is Continuation of application Ser. No. 13/188,020, filed on Jul. 21, 2011, now U.S. Pat. No. 8,604,491, for which priority is claimed under 35 U.S.C. §120, the entire contents of all of which are hereby incorporated by reference.

TECHNICAL FIELD

The present disclosure relates generally to photonic devices, and more particularly, to wafer-level devices and processes of making light-emitting diode (LED) dies.

BACKGROUND

A Light-Emitting Diode (LED), as used herein, is a semiconductor light source for generating a light at a specified wavelength or a range of wavelengths. LEDs are traditionally used for indicator lamps, and are increasingly used for displays. An LED emits light when a voltage is applied across a p-n junction formed by oppositely doping semiconductor compound layers. Different wavelengths of light can be generated using different materials by varying the bandgaps of the semiconductor layers and by fabricating an active layer within the p-n junction. Additionally, an optional phosphor material changes the properties of light generated by the LED.

Traditionally, LEDs are made by growing a plurality of light-emitting structures on a growth substrate. The light-emitting structures along with the underlying growth substrate are separated into individual LED dies. At some point before or after the separation, electrodes or conductive pads are added to the each of the LED dies to allow the conduction of electricity across the structure. The light-emitting structure and the wafer on which the light-emitting structure is formed are referred to herein as an epi wafer. LED dies are then packaged by adding a package substrate, optional phosphor material, and optics such as lens and reflectors to become an optical emitter.

The LED die is electrically connected to circuitry on the package substrate in a number of ways. One conventional connection method involves attaching the growth substrate portion of the die to the package substrate, and forming electrode pads that are connected to the p-type semiconductor layer and then-type semiconductor layer in the light-emitting structure on the die, and then bond wiring from the electrode pads to contact pads on the package substrate. When wire bonds are used at both the p-contacts and n-contacts, light may escape from the sides of the LEDs, which is generally undesirable. Also, wire bonding uses space within the package footprint, and this space is generally viewed as wasted. Thus, wire bonding approaches in one aspect can be inefficient.

Another conventional connection method involves inverting the LED die and using solder bumps to connect the electrode pads on the light-emitting structure directly to the package substrate, commonly referred to as a flip chip. However, flip chip processes at this level of LED manufacturing can be costly and inconvenient to implement. Yet another conventional connection method involves using hybrid connectors. One semiconductor layer, for example the p-type layer, may be wired bonded to the package substrate while the other layer (n-type layer) may be soldered to the package substrate.

Therefore, while existing methods of manufacturing the LED devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1-28 are cross-sectional illustrations of an example die to illustrate a wafer-level process performed to manufacture multiple dies from the same wafer-level structure;

SUMMARY

Figure 7:
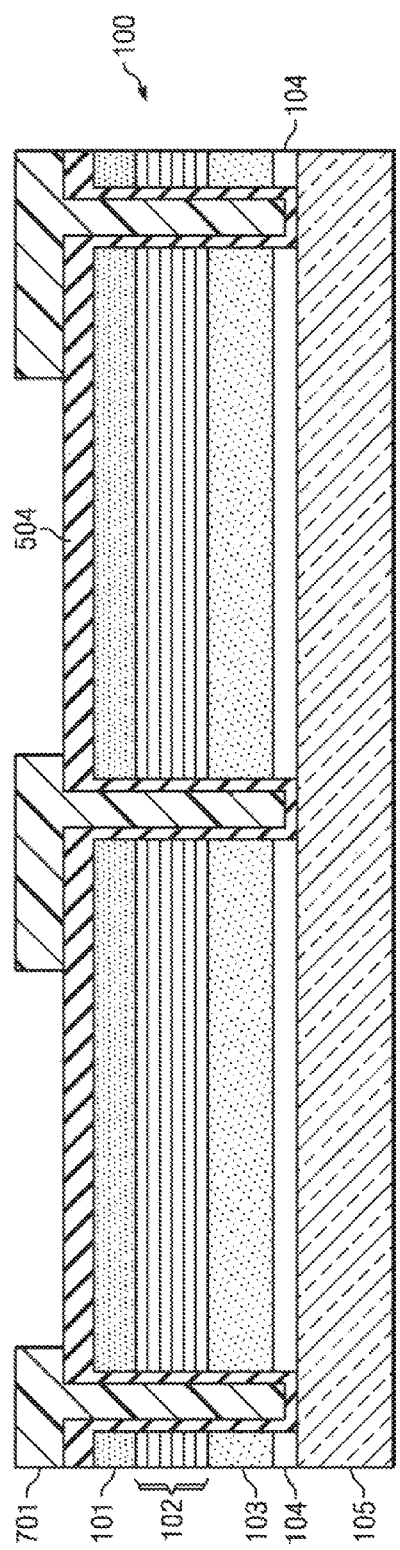

One of the broader forms of the present disclosure involves a light-emitting device which includes a first epi-structure with a to surface and a bottom surface opposite to the top surface, a first metal element disposed on the bottom surface, a second metal element disposed on the bottom surface, a first through-via, a conductive element disposed on the top surface, and a phosphor layer disposed on the top surface and covering the conductive element. The first epi-structure includes a first doped semiconductor layer, a second doped semiconductor layer closer to the bottom surface than the first doped semiconductor layer, and a light-emitting layer disposed between the first and second doped semiconductor layers. The first metal element is electrically connected to the second doped semiconductor layer. The first through-via extends through the first doped semiconductor layer and the second doped semiconductor layer, and is electrically connected to the first doped semiconductor layer and the second metal element. The conductive element is arranged in a configuration to expose a portion of the top surface, and electrically connected to the first through-via.

DETAILED DESCRIPTION it is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. In addition, the present disclosure may repeat reference numerals and/or letters in the various examples. This repetition is for the purpose of simplicity and clarity and does not in itself dictate a relationship between the various embodiments and/or configurations discussed.

various embodiments include wafer-level techniques to manufacture multiple LEDs at the same time using the same processes. An epi wafer is coupled to a carrier wafer with precision, using alignment marks to align metal contact pads on the respective wafers. Eutectic bonding or other bonding techniques can be used to bond the metal pads. The LEDs are formed as dies on the wafers and are separated from each other using dicing or other available methods.

Each of the dies uses a via that extends through the thickness of the epi wafer to provide a conductive contact from then-doped region at the top of the epi wafer to a pad at the bottom side of the epi wafer. The epi via is in contact with a via through the carrier wafer to create a conductive path from the top of the epi wafer to the bottom of the carrier wafer. An external contact pad at the bottom of the carrier wafer acts as an n-contact for the LED.

similarly, a p-doped portion at the bottom of the epi wafer is in electrical contact with a metal conductive pad on the bottom of the epi wafer. The metal conductive pad is in electrical contact with a via through the carrier wafer, which electrically contacts an external contact pad at the bottom of the carrier wafer. Each LED can have more or fewer external contact pads, but the embodiments described herein have at least an n-contact pad a p-contact pad on the external bottom surface of the carrier wafer. The external contact pads can be used for surface mounting the LED onto a sub-mount.

various embodiments can be fashioned as single junction LEDs or as multi junction LEDs using the vias, as described more fully below. Furthermore, a phosphor coating can be applied to the epi wafer before the dicing process.

FIGS. 1-28 are diagrammatic fragmentary cross-sectional side views of a wafer-level structure during various stages in accordance with an embodiment of the method for manufacturing photonic devices. The photonic device may be a light-emitting diode (LED) device. It is understood that FIGS. 1-28 have been simplified for a better understanding of the inventive concepts of the present disclosure. Accordingly, it should be noted that additional processes may be provided before, during, and after the method illustrated in FIGS. 1-28 and that some other processes may only be briefly described herein.

Referring now to FIG. 1, epi wafer 100 is provided. In one example, wafer 100 is cleaned using, e.g., a mixture of hydrochloric acid or other chemicals.

Wafer 100 includes several features. In this example, epi wafer 100 includes GaN, though other embodiments may use different materials. It should also be noted that some embodiments include an epi wafer with GaN layers as well as other layers with materials other than GaN. P-doped portion 101 is adjacent multiple quantum well (MQW) structure 102. MQW structure 102 is similar to quantum well structures in other photonic devices and provides quantum confinement for electrons, thereby providing consistent light emission by the photonic device. N-doped portion 103 is adjacent MQW structure 103. Un-doped portion 104 is at the boundary of the GaN material. Wafer 100 is built on sapphire wafer 105. In this example, sapphire wafer 105 is removed in a subsequent step using laser etching and lift-off. In some embodiments, other materials may be used instead of sapphire, for example, GaN wafer, SiC wafer, and silicon wafer. It should be noted that FIGS. 1-28 do not show the entire length of wafer 100, but rather only show a portion that corresponds to a single die. It is understood that the actions shown in the subsequent figures are applied to other portions of wafer 100 to form many dies substantially simultaneously.

the doped layers 101 and 103 and the MQW layer 102 may be formed by an epitaxial growth process known in the art. In the epitaxial growth process, sapphire 105 acts as a seed crystal, and the layers 101-103 take on a lattice structure and an orientation that are substantially identical to those of sapphire 105. After the completion of the epitaxial growth process, a PIN junction (or a PIN diode) is formed by the disposition of the MQW layer 102 between the doped layers 101 and 103. In the completed device, when an electrical voltage (or electrical charge) is applied to the doped layers 101 and 103, electrical current flows through the photonic device, and the MQW layer 102 emits radiation such as observable light. The color of the light emitted by the MQW layer 102 corresponds to the wavelength of the light, which may be tuned by varying the composition and structure of the materials that make up the MQW layer 102.

Referring to FIG. 2, oxide layer 106 is formed on p-doped portion 101. Oxide layer 106 can be formed using any appropriate method, including in this case Plasma Enhanced Chemical Vapor Deposition (PECVD). Oxide layer 106 acts a hard mask in this embodiment. Oxide layer 106 is eventually removed and does not form part of the end structure.

In FIG. 3, photoresist layer 107 is applied in a pattern over oxide layer 106. Photoresist layer 107 is used in this embodiment to define, at least in part, the dimensions of the die. Gaps 301 and 303 are used to form the lateral boundaries of the die that is fashioned by the process shown herein. Gap 302 is used to form a trench that separates two sides of the die. As shown in subsequent steps, the trench formed using gap 302 is used to facilitate the formation of a multi junction device. In an embodiment comprising a single-junction device, the trench formed by gap 302 may be omitted.

In FIG. 4, oxide layer 106 is etched using the pattern in photoresist layer 107. In this example, a buffered oxide wet etch is used, though other embodiments may use different etching techniques.

FIG. 5 shows a mesa etch that forms trenches 501, 502, 503 in wafer 100. In this embodiment, the mesa etch is performed using inductively coupled plasma to remove the GaN material of layers 101-104. The etching stops at sapphire wafer 105. Trenches 501 and 503 define the boundary of the particular die that is illustrated in FIGS. 1-28. Trench 502 is used to facilitate the formation of the multi junction device. Photoresist layer 107 is removed using, e.g., a photoresist stripper after the mesa etch is performed.

In FIG. 6, the first oxide layer 106 is removed using, e.g., another buffered oxide wet etch. It is replaced by a second oxide layer 504 that is formed by, e.g., PECVD. By removing oxide layer 106, the process reduces the aspect ratio of trenches 501-503. The reduced aspect ratio allows for the oxide material of layer 504 to coat the walls of trenches 501-503. Thus, the process of FIG. 6 provides for sidewall passivation of trenches 501-503.

Referring now to FIG. 7, photoresist layer 701 is applied to wafer 100 in a pattern that leaves some portions of oxide layer 504 exposed. Photoresist layer 701 is applied in trenches 501-503, as well as on top of layer 504.

Figure 8:
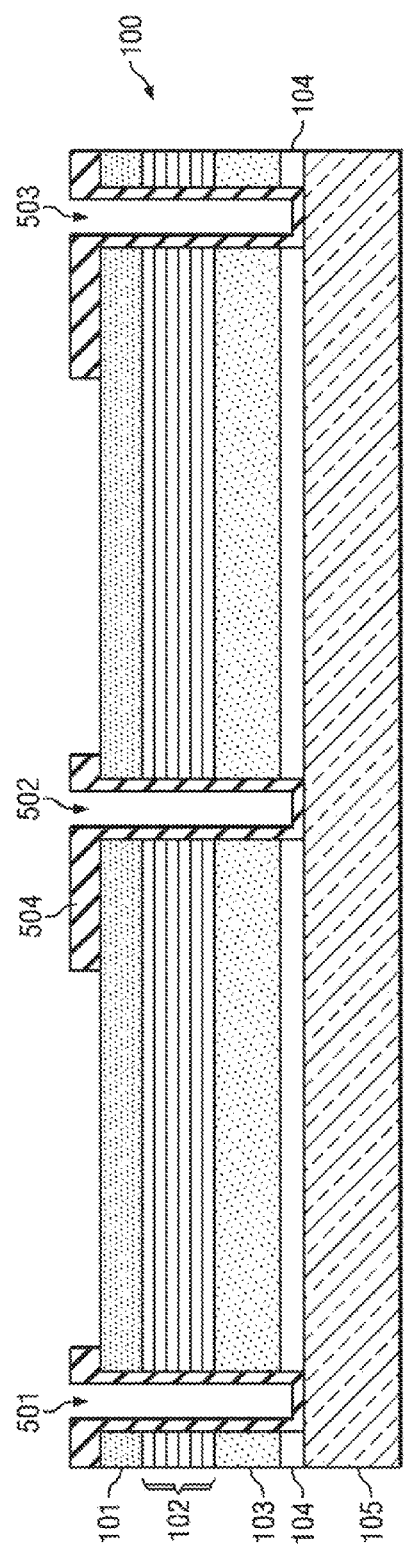

In FIG. 8, a buffered oxide wet etch is applied to wafer 100 to remove the portions of oxide layer 504 exposed by photoresist layer 701. Photoresist layer 701 is then removed using, e.g., stripper, to create the structure shown in FIG. 8. Oxide layer 504 is removed, except for portions surrounding trenches 501-503 and on the sidewalls of trenches 501-503. Much of the material of oxide layer 504 remains in the finished product, as shown in subsequent figures.

FIG. 9 shows a third photoresist layer 902 applied to wafer 100. The photoresist layer is applied in the pattern shown in FIG. 9 to accommodate p-ohmic reflector material 901 in desired places on wafer 100. P-ohmic reflector material 901 serves two purposes in the device of this embodiment. In a first aspect, p-ohmic reflector material 901 makes ohmic contact with p-doped layer 101. In another aspect, p-ohmic reflector material 901 acts as a light reflector to direct light in a desired direction in the final device.

P-ohmic reflector material can be made of any of a variety of materials. In some examples, a nickel/silver mix may be used. In other embodiments, a pure silver or silver/nickel mixture may be used. P-ohmic reflector material 901 may be applied using, e.g., an evaporation process.

Following the formation of p-ohmic reflector material 901, photoresist stripper is applied to remove photoresist material 902, as well as any p-ohmic reflector material on top of photoresist material 902. In FIG. 10, another layer of photoresist material 1001 is applied in a pattern as shown. Photoresist material 1001 is also applied in trenches 501-503. Portions of p-ohmic reflector material 901, oxide layer 504, and p-doped material 101 are exposed in FIG. 10.

Figure 11:
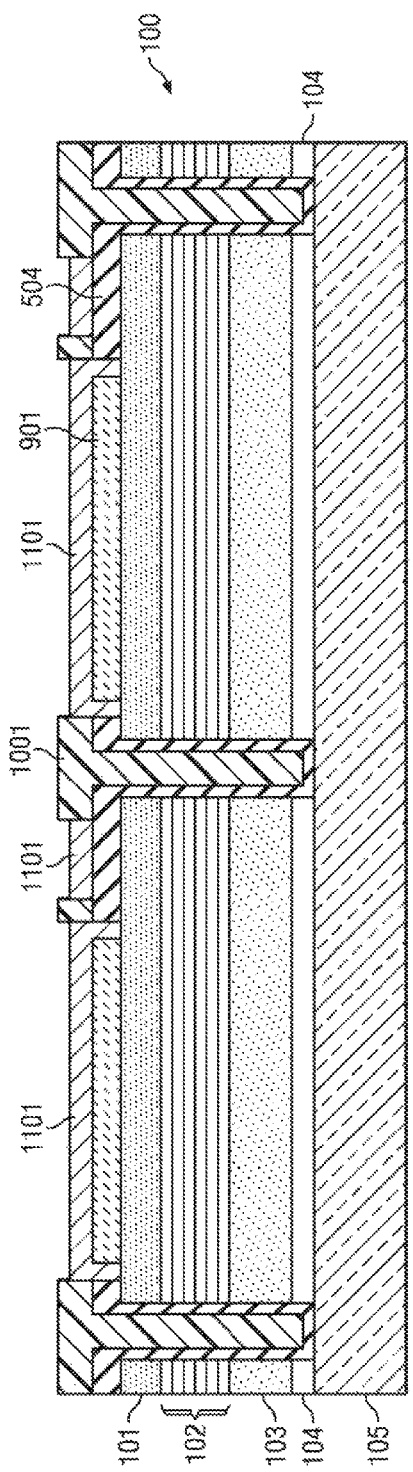

In FIG. 11, metal 1101 are deposited over the wafer 100. In this example, the metal 1101 includes both a diffusion barrier and a bonding metal. The diffusion barrier prevents metal from diffusing into p-ohmic reflector material 901. The diffusion barrier may include multi-layer titanium and tungsten.

The bonding metal of metal 1101 may include, e.g., gold or a gold/ton mixture. Metal 1101 can be applied using Physical Vapor Deposition (PVD) or plating. In one example, metal 1101 are applied over photoresist material 1001. When photoresist material 1001 is stripped, the portions of metal 1101 that lie on top of photoresist material 1001 are removed as well, leaving the structure shown in FIG. 12.

Figure 12:
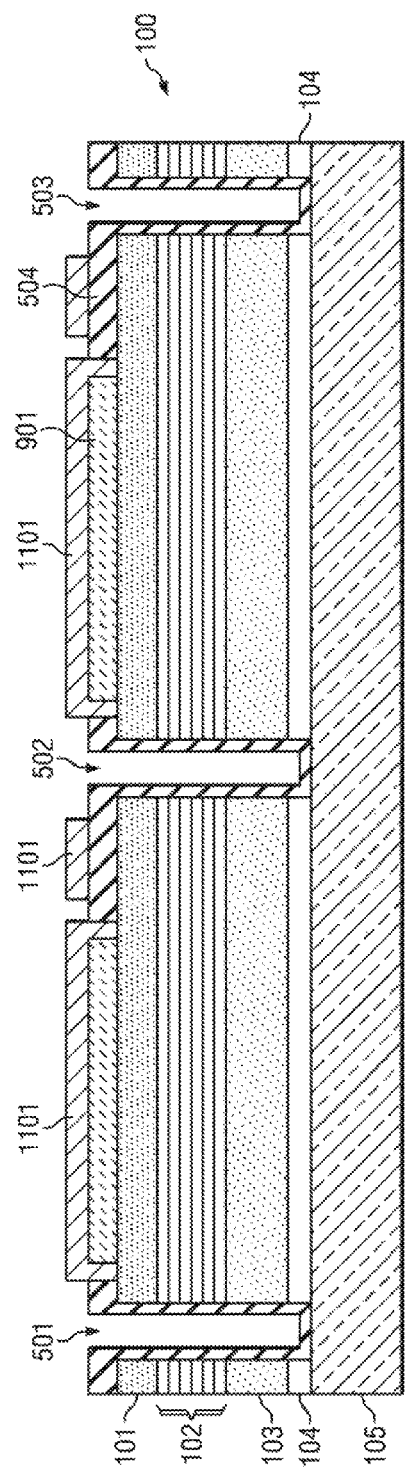

In FIG. 12, photoresist material 1001 is removed by, e.g., applying a photoresist stripper. Trenches 501-503 are opened up once again. Also, metal 1101 is exposed and built out above layer 504. Furthermore, the top surface of metal 1101 is substantially coplanar, allowing it to be bonded to corresponding metal portions on a silicon wafer shown in subsequent figures.

Figure 13:
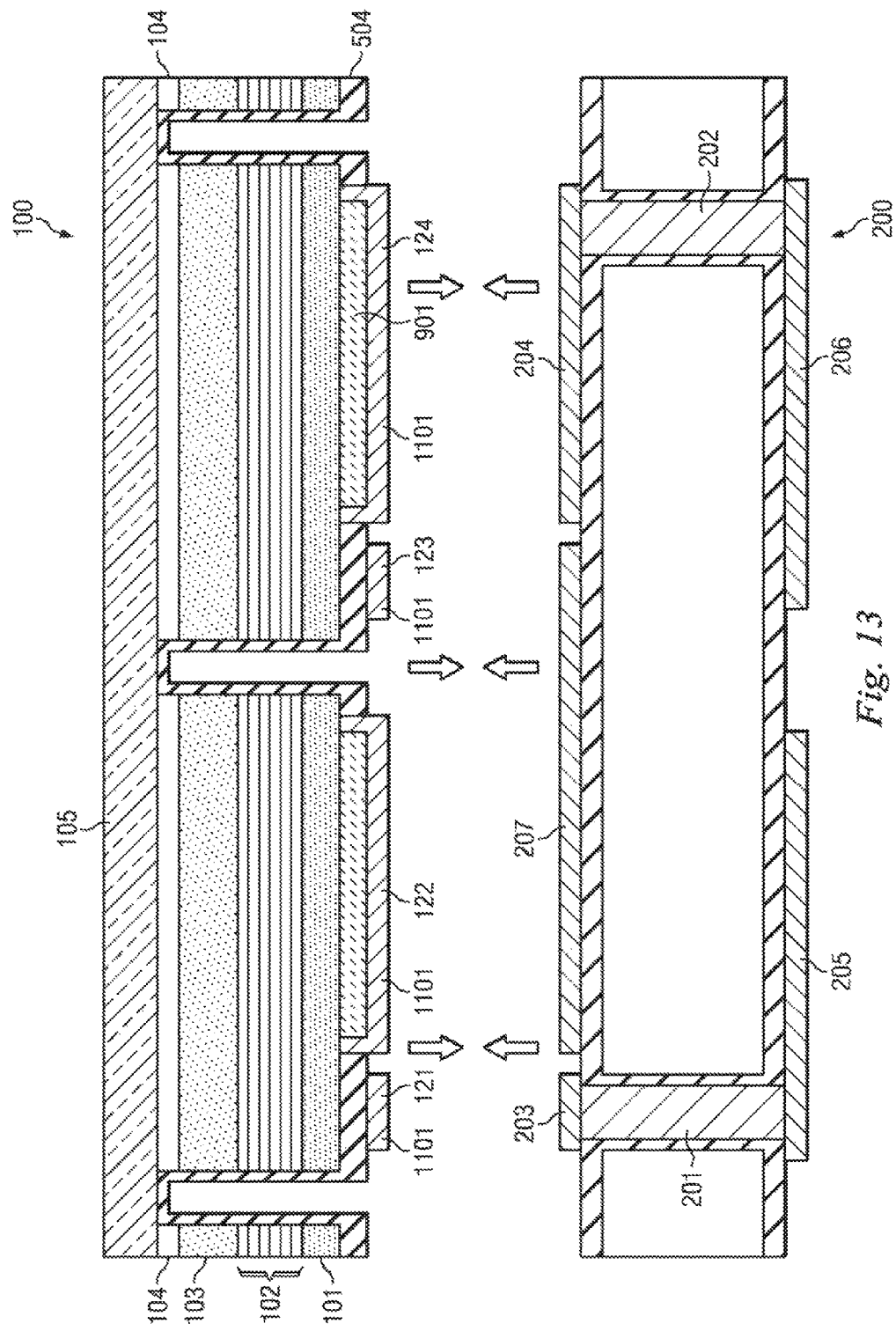
Figure 14:
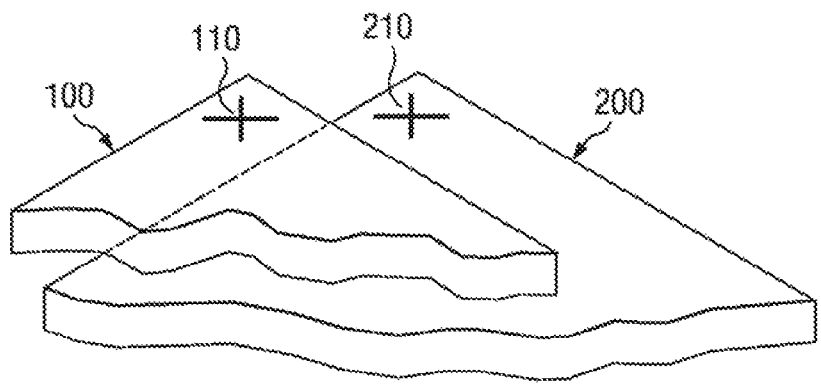

Wafer 100 is then flipped, as shown in FIG. 13. FIG. 13 shows wafer 100 being aligned with carrier wafer 200, which in this example, is a semi-insulating silicon wafer. Other embodiments may include other structures for wafer 200, such as for example a ceramic carrier wafer, a Metal Core Printed Circuit Board (MCPCB), etc. Various embodiments perform alignment according to one or more alignment techniques. FIG. 14 shows an example alignment technique in a top-down view, wherein wafer 100 includes alignment marker 110, and wafer 200 includes alignment marker 210. A computer-controlled manufacturing machine uses infrared sensor technology to "see" alignment marks 110 and 210 and employs a feedback loop to precisely align wafers 100, 200 using alignment marks 110, 210. In another example, the computer-controlled manufacturing machine uses a Charge Coupled Device (CCD) as a sensor to see alignment marks 110, 210 with visible light. The scope of embodiments is not limited to any particular technique for aligning wafers 100, 200, as long as the technique employed provides sufficient precision to line up the metal portions shown in FIG. 13.

Returning to FIG. 13, wafer 200 includes vias 201, 202 that connect metal structures on one side of wafer 200 with metal structures on the other side of wafer 200. In the present example in which carrier wafer 200 is a silicon wafer, vias 201, 202 may be referred to as Through Silicon Vias (TSVs). Wafer 200 has metal contact pads 203, 204. Via 201 electrically connects contact pad 203 with external contact pad 206. Similarly, via 202 electrically connects contact pad 204 with external contact pad 206. As will be explained in more detail below, external contact pad 205 is used as an n-contact for the die, and external contact pad 206 is used as a p-contact for the die, providing electrical contact with respective portions of epi wafer 100.

Contact pad 207 does not connect directly with an external contact pad 205, 206, but it does connect with metal pads 122, 123 on wafer 100. Contact pad 203 makes electrical contact with contact pad 121, and contact pad 204 makes electrical contact with contact pad 124.

The metal features of carrier wafer 200 may be made of any of a variety of materials, such as, e.g., tin or a tin/copper mixture. The metal features may be formed, e.g., by electroplating processes. The alignment process of FIG. 13 includes making contact between wafers 100, 200. The metal portions in contact with each other may be bonded using eutectic bonding or diffusion bonding.

Figure 15:
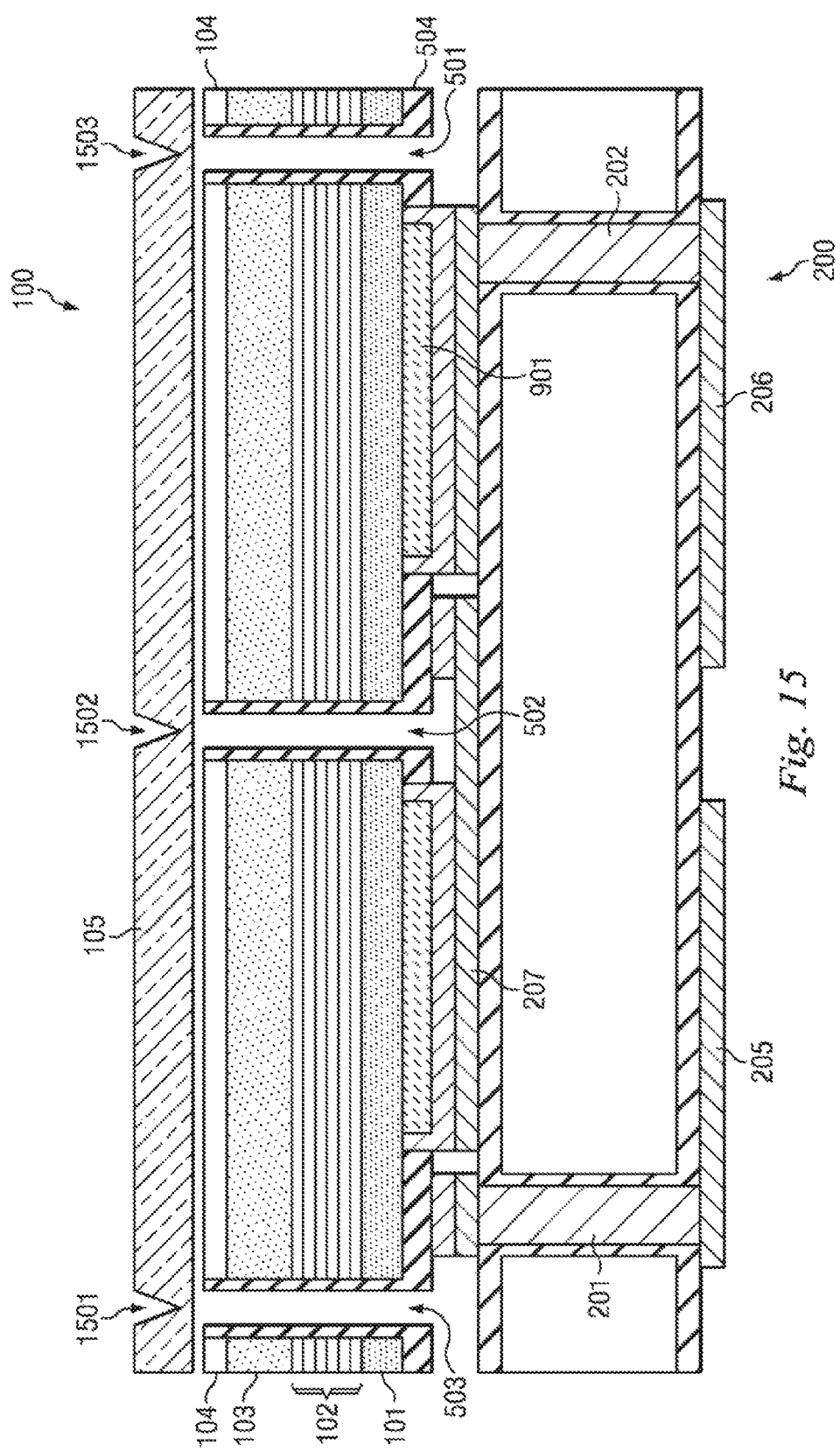

In FIG. 15, laser scribing is used to make triangle trenches 1501-1503 in sapphire wafer 105. Then, laser lift off is performed to remove sapphire wafer 105 and expose un-doped GaN 104.

Figure 16:
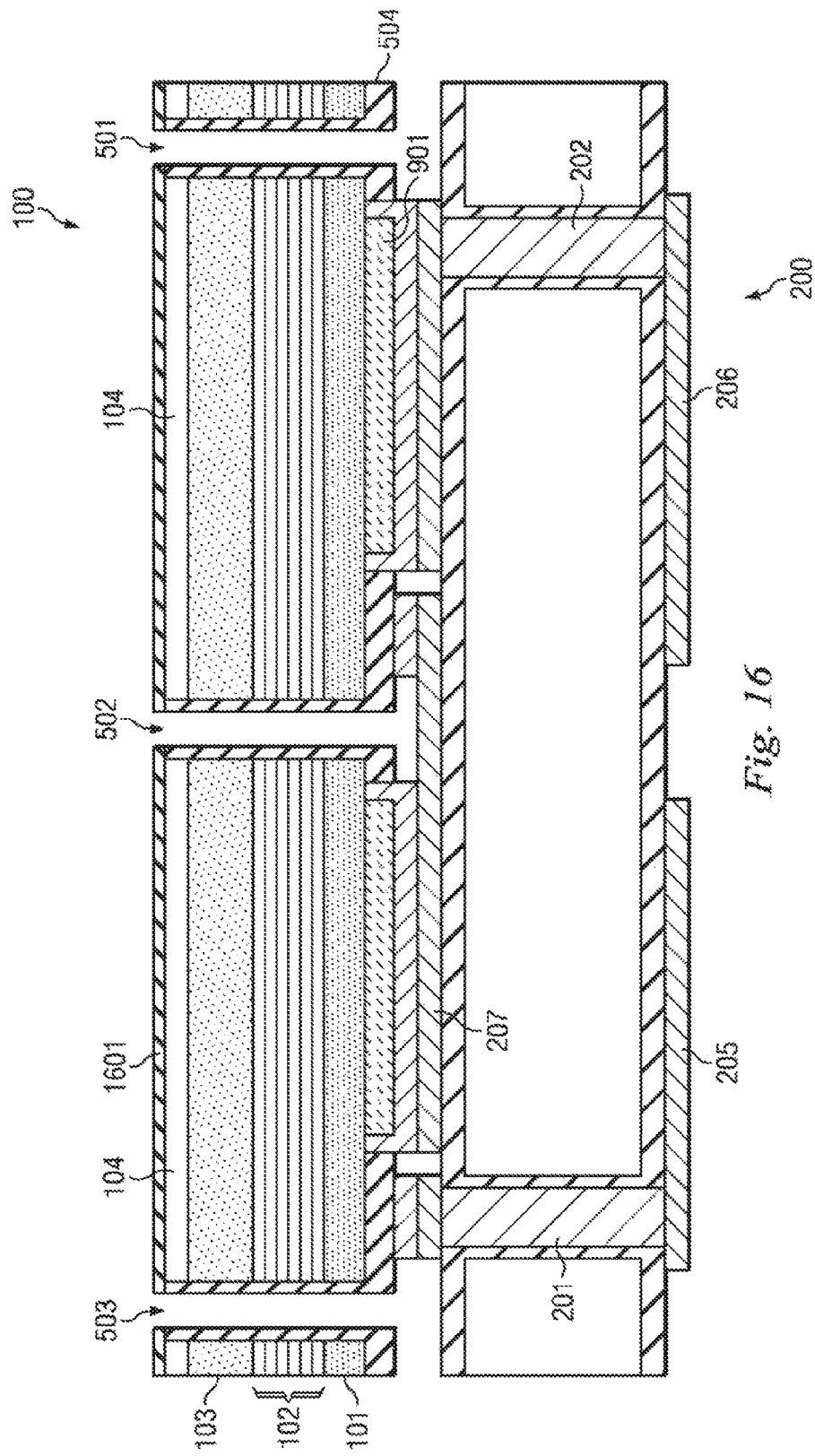

In FIG. 16, another hard mask is made using silicon oxide. Specifically, oxide layer 1601 is applied on un-doped GaN and used in subsequent steps as a hard mask. Oxide layer 1601 may be applied using, e.g., PECVD.

Trenches 501-503 remain. In the present example, trench 502 splits the epi portion of the die substantially in half. However, contact pad 207 electrically connects the two halves. It is shown in subsequent figures that contact 207 facilitates the formation of the multi junction LED device of this embodiment.

Figure 17:
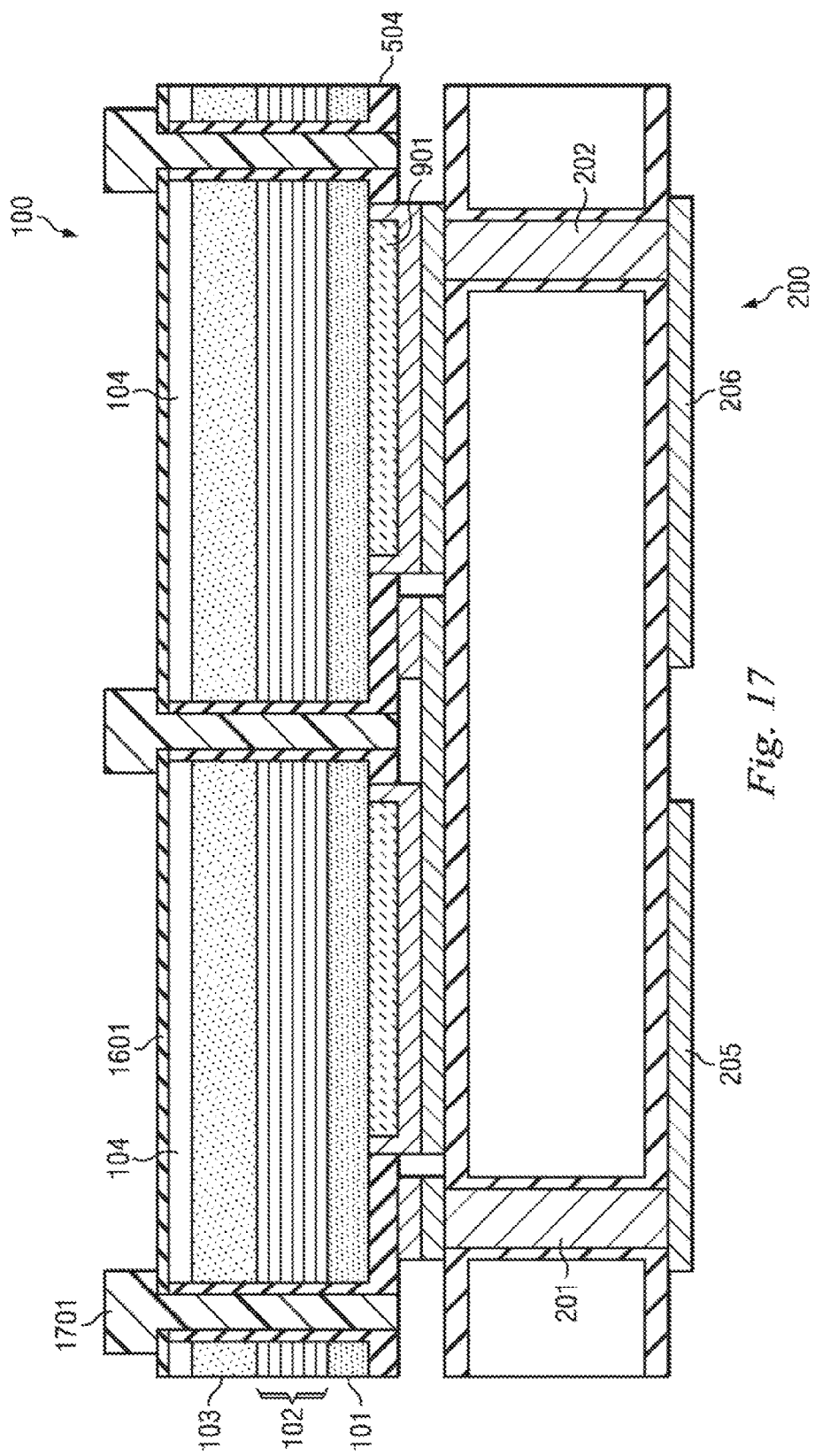

In FIG. 17, photoresist layer 1701 is applied over oxide layer 1601 in the pattern shown. Photoresist layer 1701 is the fifth photoresist layer applied thus far (and not the last). Additional photoresist layers in subsequent steps are used to further define features of the die. In the present example, photoresist layer 1701 is used to pattern un-doped GaN 104 and to further define the areas surrounding trenches 501-503.

Figure 18:
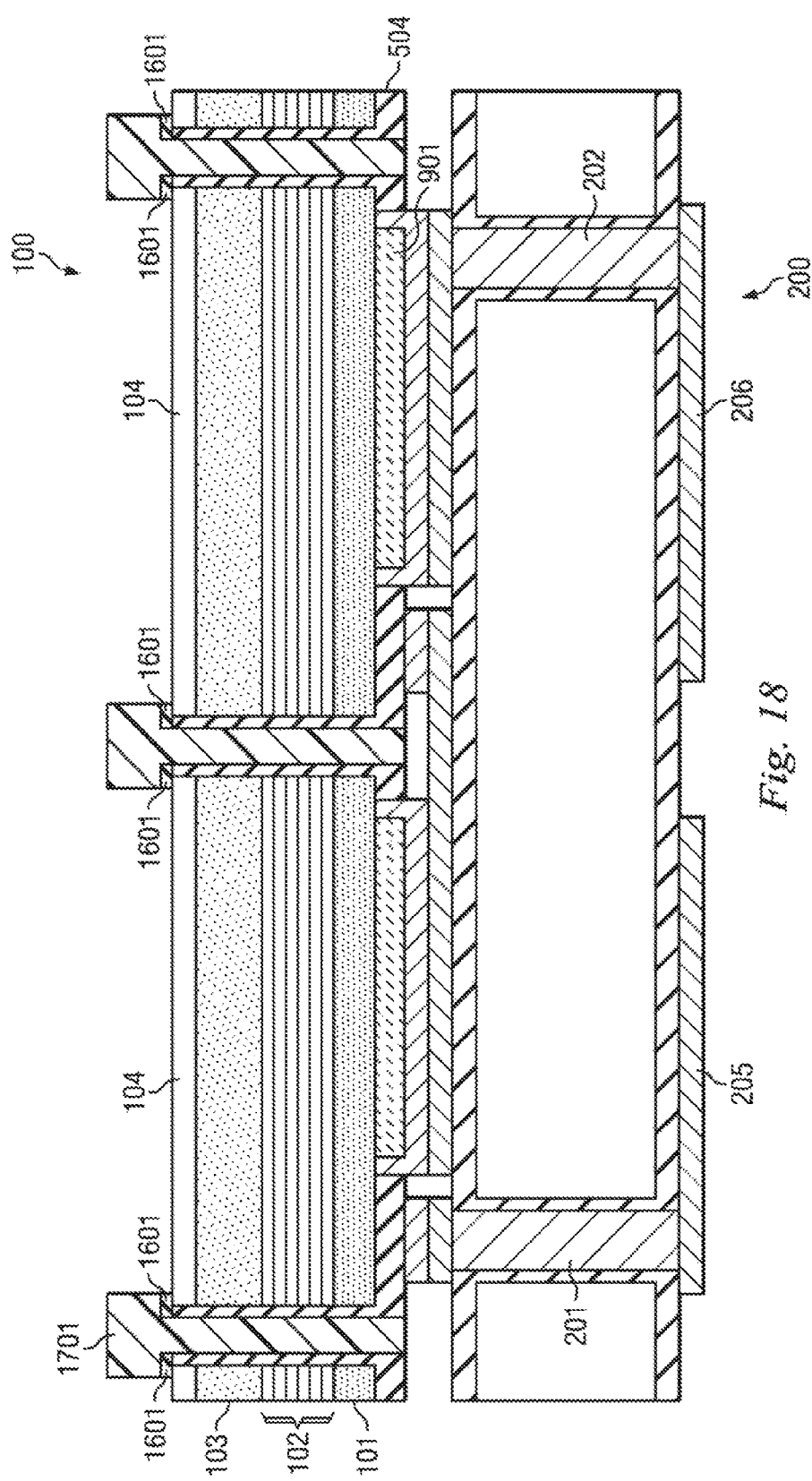

In FIG. 18, a reactive ion etch may be used to remove the portions of oxide layer 1601 that are exposed. Small portions of oxide layer 1601 remain and are illustrated in FIG. 17 for reference. In FIG. 18, un-doped GaN is exposed by the removal of oxide layer 1601.

Figure 19:
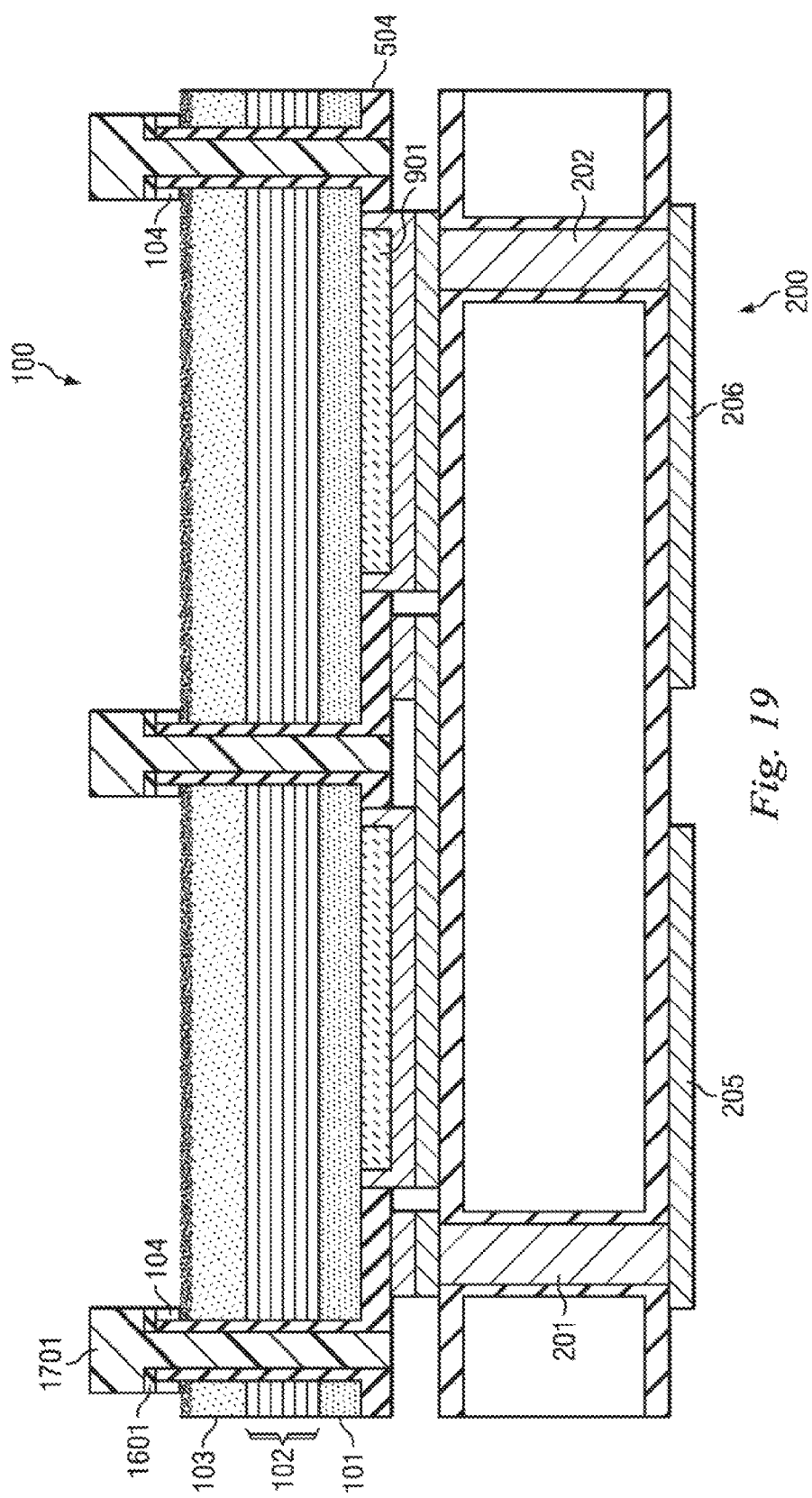

In FIG. 19, the exposed portions of un-doped GaN 104 are etched away. In one example, an inductively coupled plasma etch may be used to remove the un-doped GaN 104, thereby exposing the surface of then-doped GaN 103. Photoresist layer 1701 remains and is used to pattern un-doped GaN 104 in this example.

Further in FIG. 19, n-doped GaN 103 is roughened to prepare it for metal deposition in subsequent steps. Roughening can be performed using, e.g., a solution of potassium hydroxide (KOH).

Figure 20:
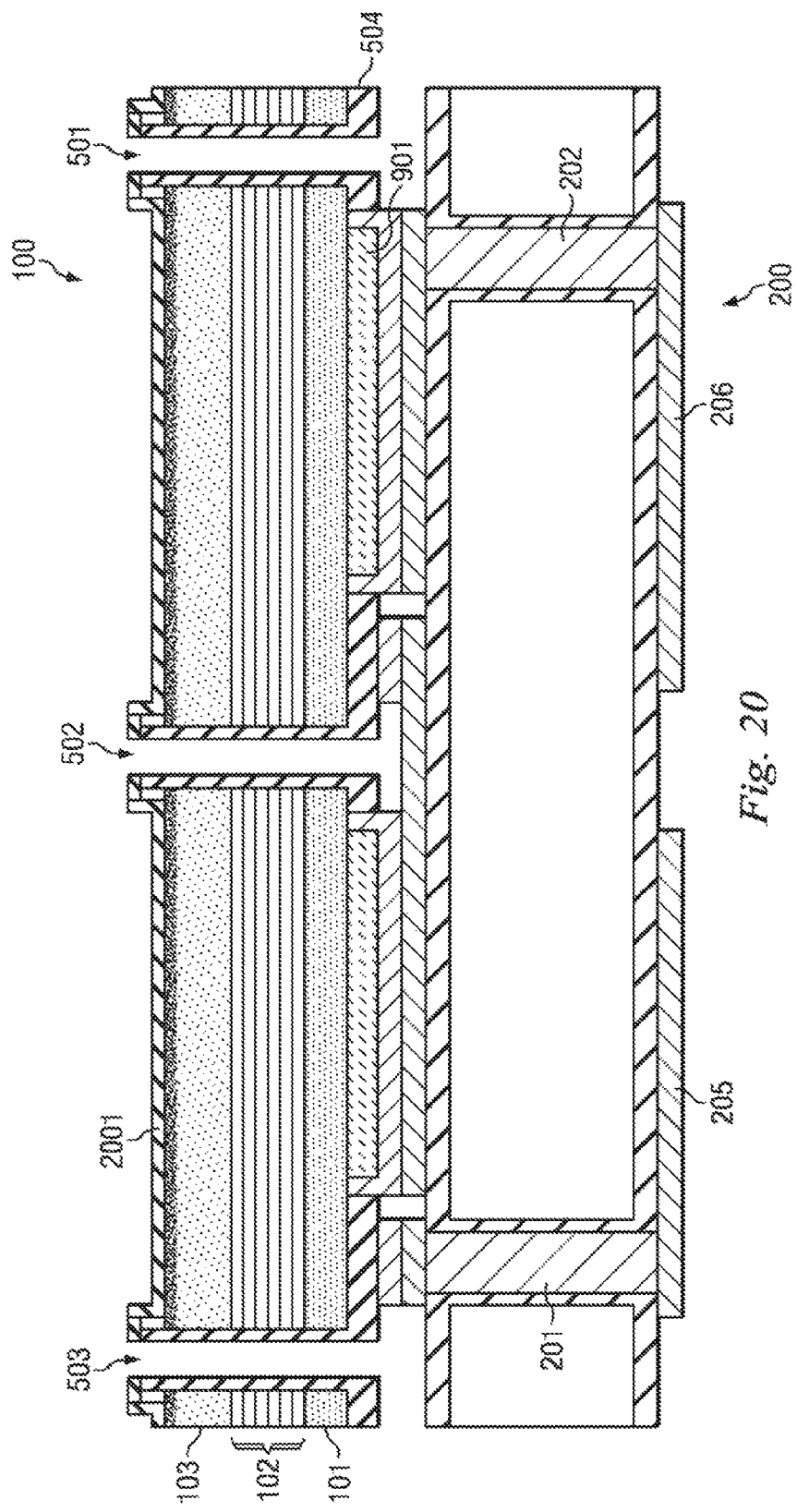

In FIG. 20, yet another oxide layer is deposited after photoresist layer 1701 is removed. Similar to other examples in this embodiment, photoresist layer 1701 may be removed using a photoresist stripper. Oxide layer 2001 is deposited using, e.g., PECVD in a manner similar to other oxide layers in this embodiment. Oxide layer 2001 is deposited on top of roughened n-doped GaN layer 103. Oxide layer 2001 is used as a hard mask in forming vias through the GaN material, as shown in subsequent figures. Trenches 501-503 remain and are not filled in by the oxide deposition step shown in FIG. 20.

Figure 21:
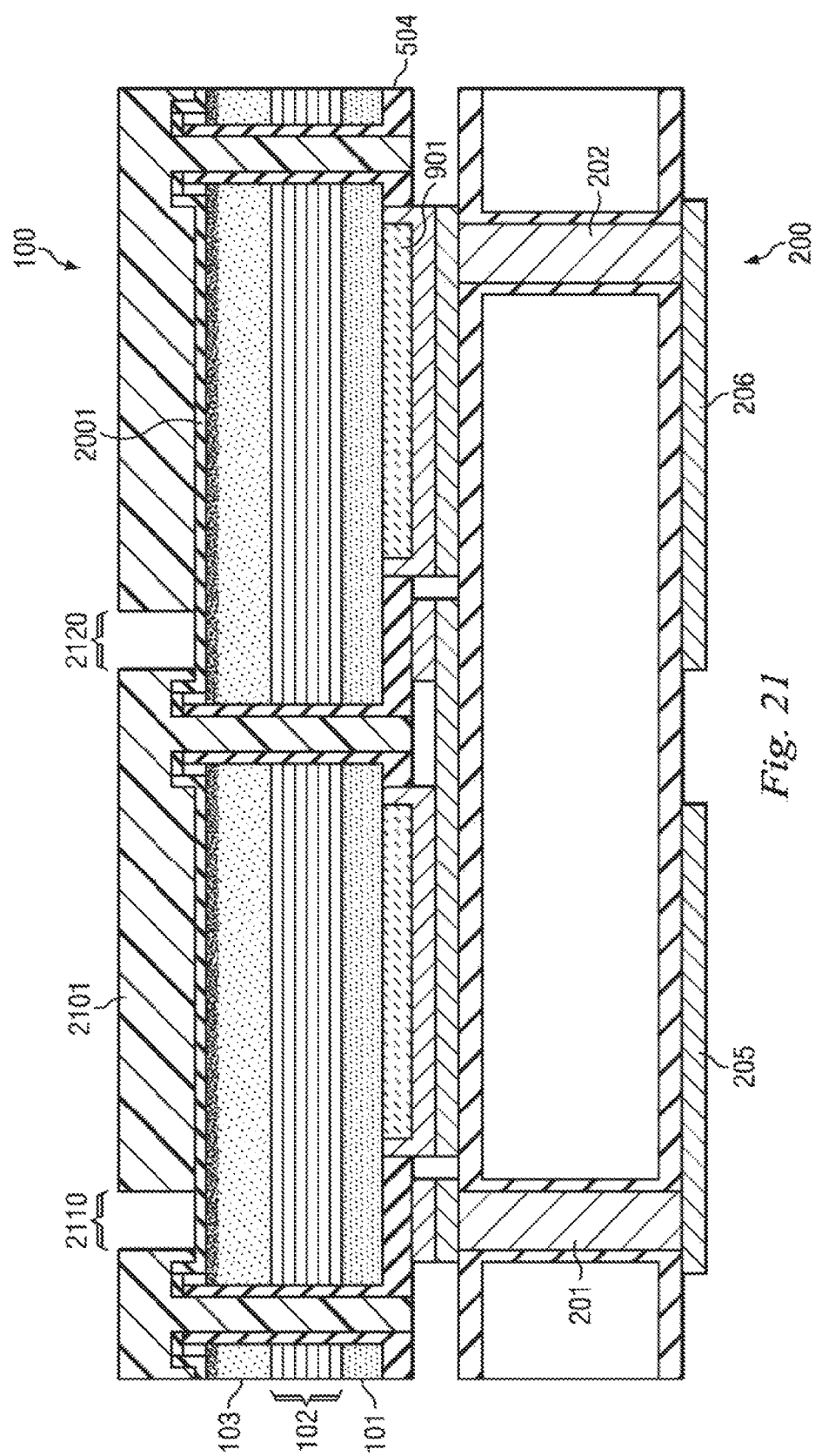

In FIG. 21, another photoresist layer 2101 is applied to the structure. The actions shown thus far focus on defining the shape of the die and bonding wafers 100, 200 together. In FIG. 21, the shape and placement of the vias in the epi wafer become apparent. Specifically, the openings 2110, 2120 in photoresist layer 2101 define the positions and dimensions of the vias in subsequent steps. In this example where wafer 100 is a GaN epi wafer, the vias through wafer 100 may be referred to as Through GaN Vias (TGVs). Photoresist layer 2101 is the sixth of eight photoresist layers applied and removed in this example embodiment. Trenches 501-503 are filled by photoresist layer 2101.

Figure 22:
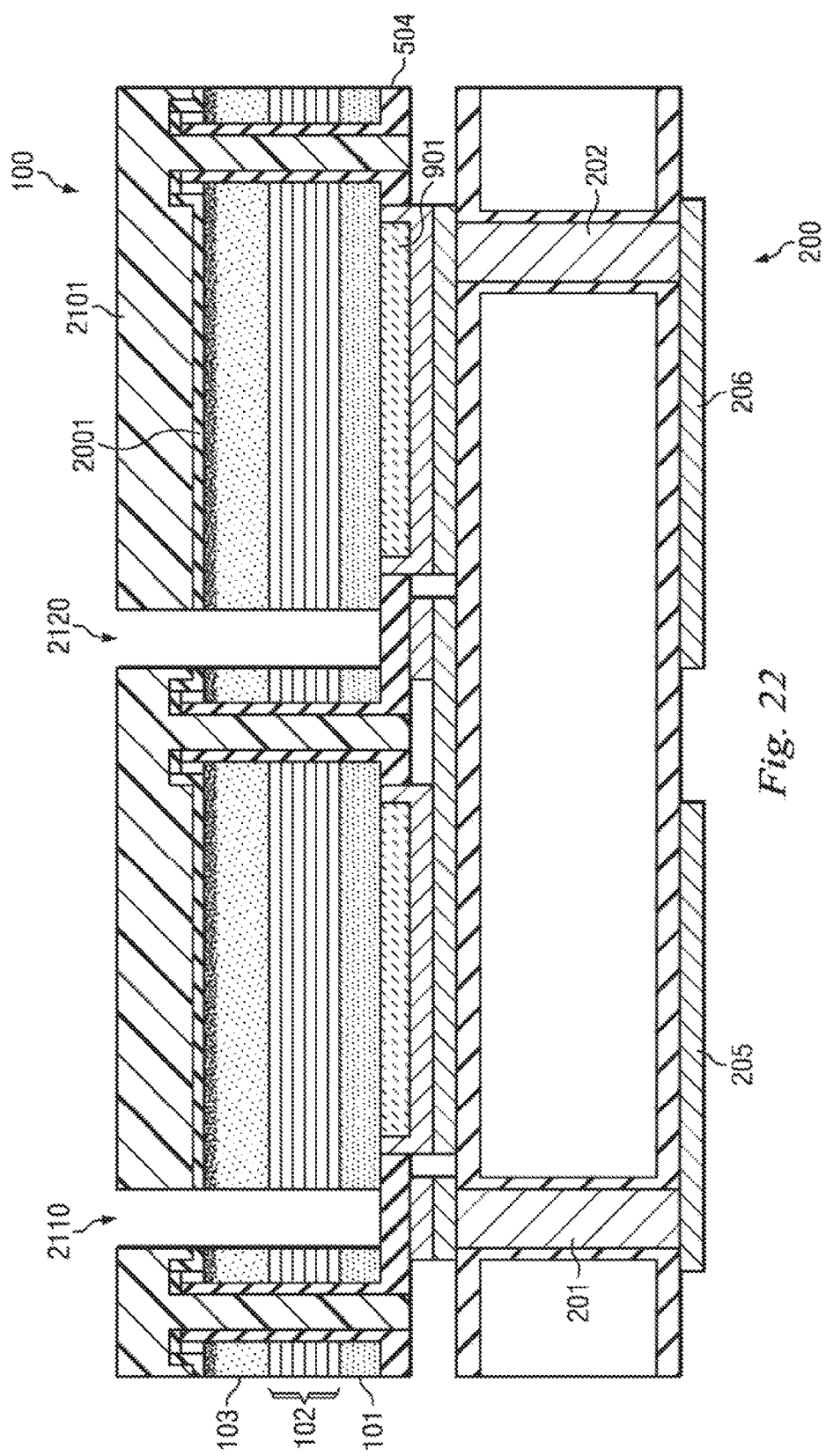

FIG. 22 shows a two-step etching process that is used to remove material down to the oxide layer 504. Exposed portions of oxide layer 2001 are removed using, e.g., a reactive ion etch process. Then, an inductively coupled plasma etch may be used to remove exposed portions of GaN. Specifically, the inductively coupled plasma etch process removes layers 101-103 within the openings 2110, 2120. Further steps fabricate the TGV s in the trenches of openings 2110, 2120. In some examples, the TGVs formed in the openings 2110, 2120 may have a shape that is less like traditional vias and more like an interconnect and may, therefore, be more accurately referred to as interconnects.

Figure 23:
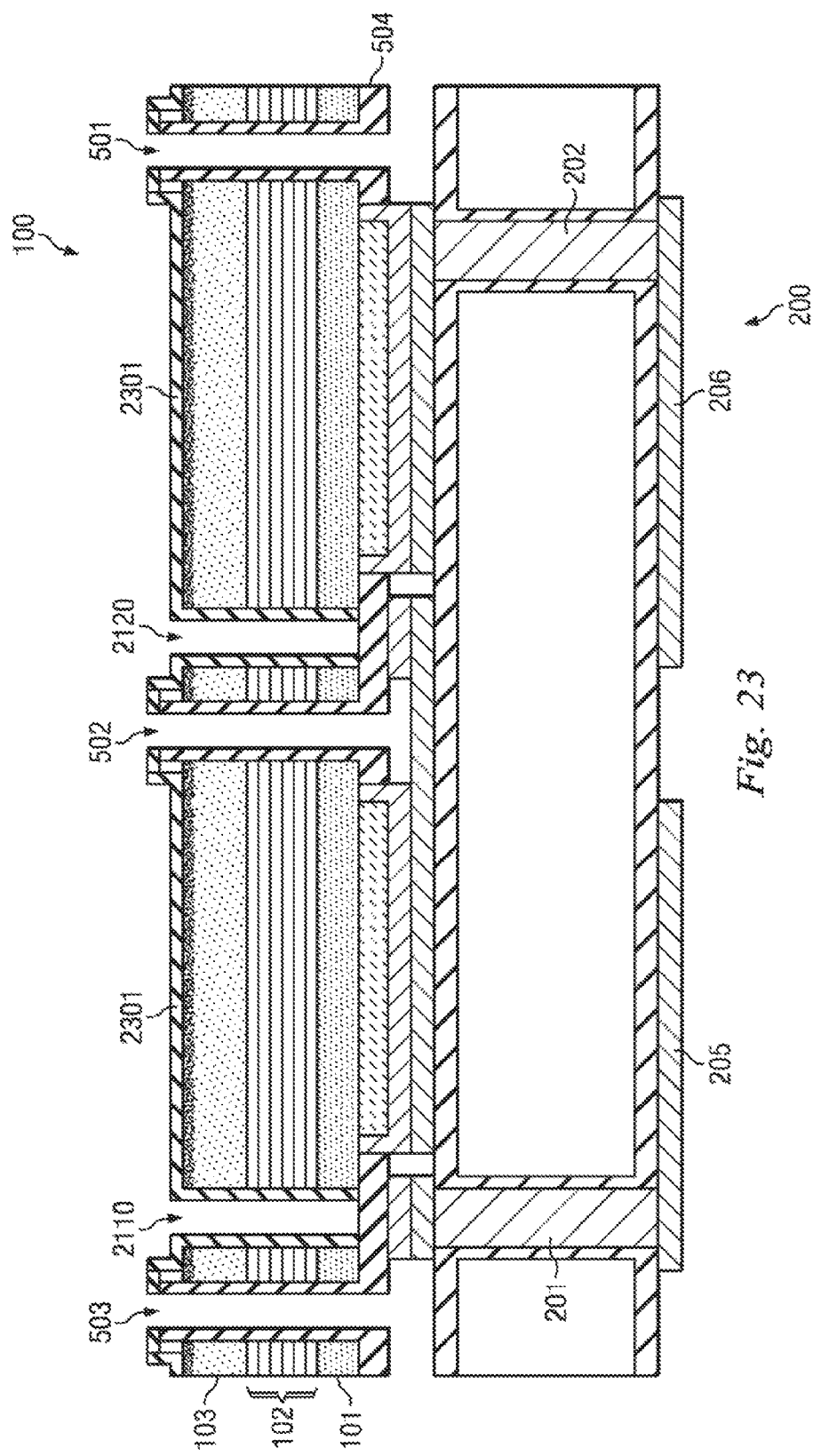

In FIG. 23, photoresist layer 2101 is removed using, e.g., photoresist stripper. After photoresist 2101 is removed, oxide layer 2301 is deposited using, e.g., PECVD. Oxide layer 2301 provides passivation of the sidewalls of the TGV s, as shown in openings 2110, 2120. Trenches 501-503 remain substantially the same and are not effectively filled in by the oxide deposition process of FIG. 23.

Figure 24:
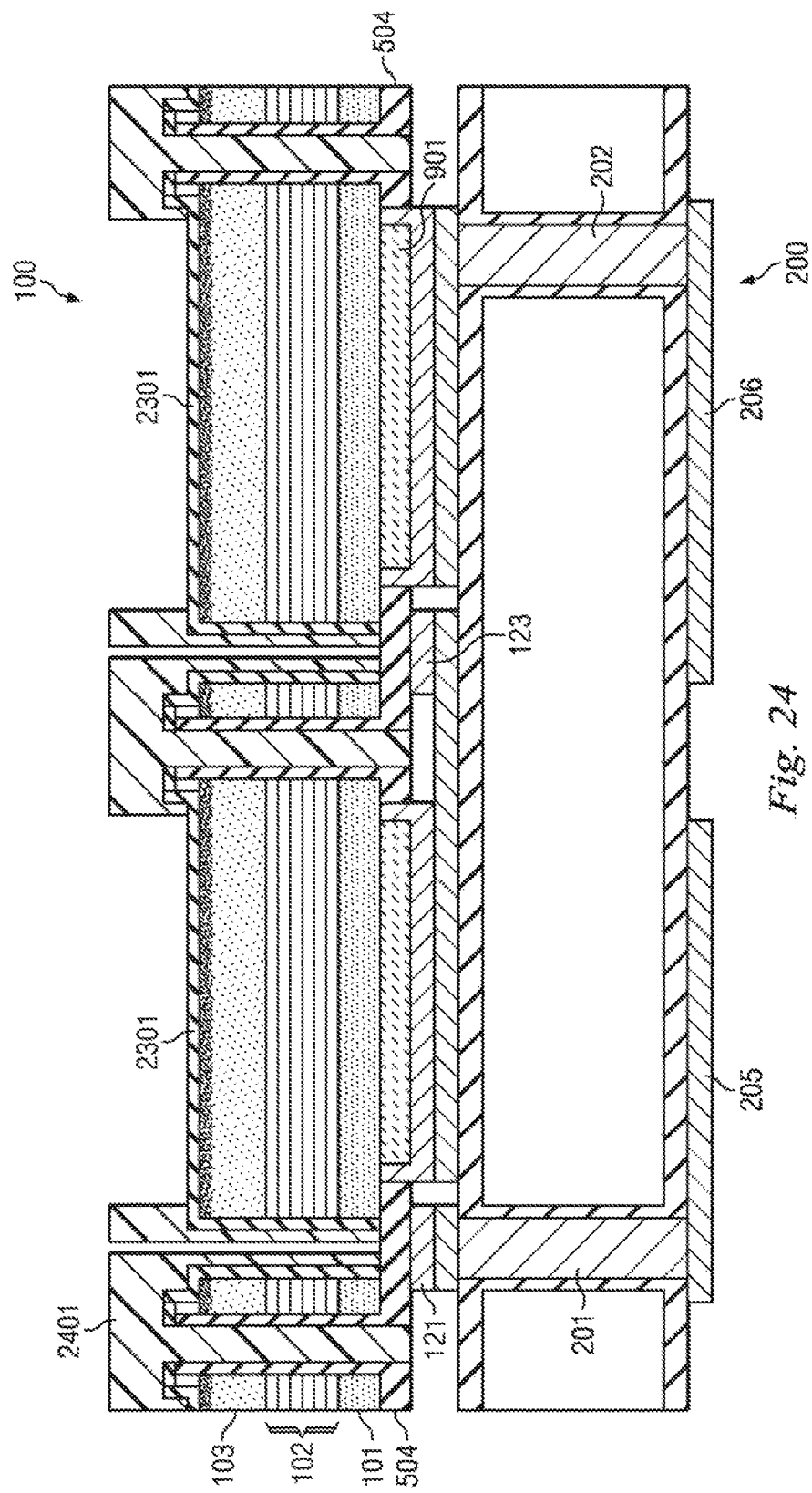

In FIG. 24, photoresist layer 2401 is applied to the structure to cover and fill trenches 501-503. Photoresist layer 2401 performs two functions in this embodiment. In a first aspect, photoresist layer 2401 exposes portions of oxide layer 2301, allowing those portions to be etched away. Additionally, photoresist layer 2401 exposes portions of oxide layer 504 for the TGVs.

Figure 25:
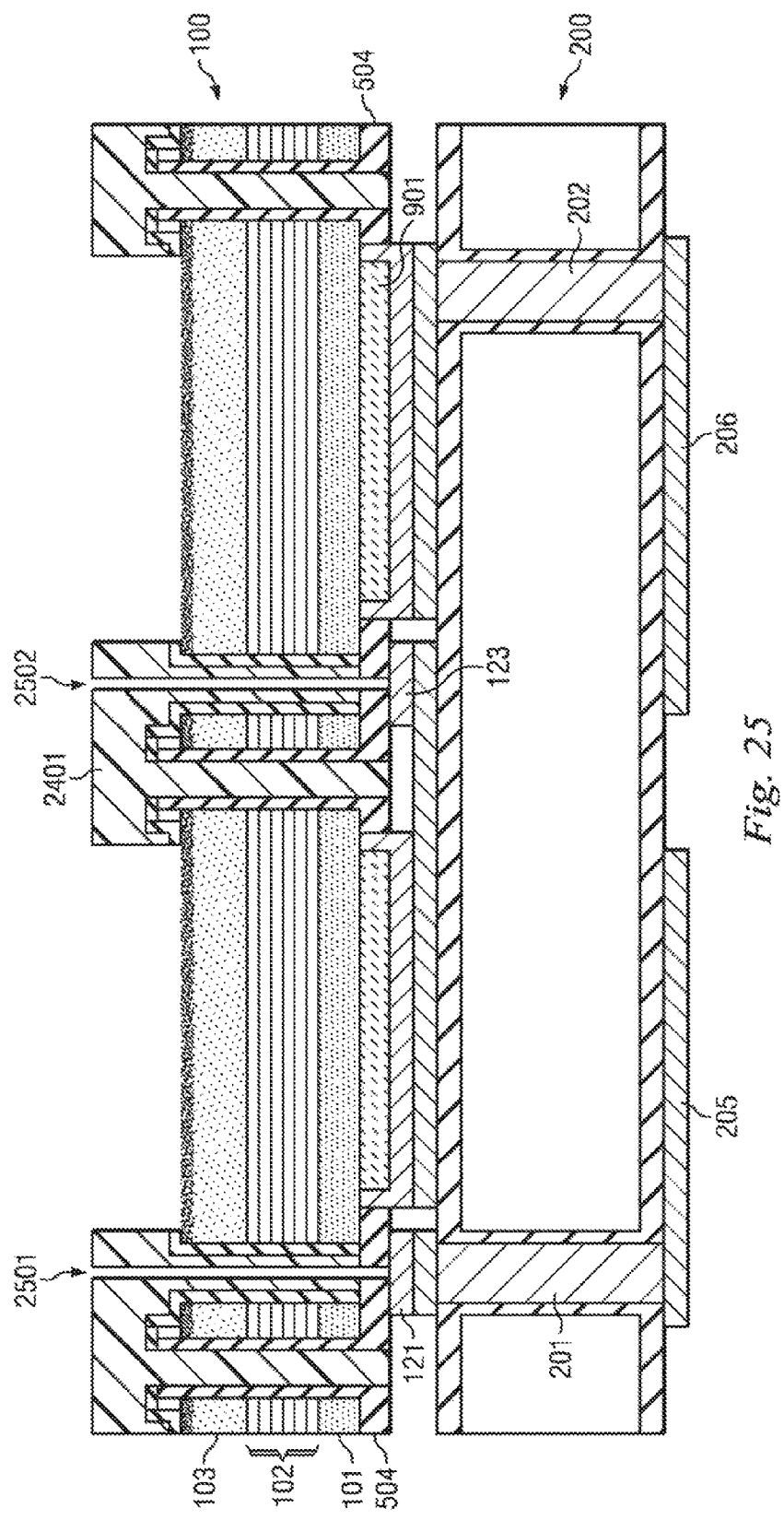

In FIG. 25, a reactive ion etch may be performed to remove parts of oxide layer 504 in lighting areas 2501, 2502. The etch also removes the exposed portions of oxide layer 2301.

the etch illustrated in FIG. 25 provides an exposed portion of metal for each of the TGVs. Specifically, metal contact pads 121, 123, which are bonded to corresponding metal structures on wafer 200, are exposed in their respective lighting areas 2501, 2502, and when the metal features of the TGVs are formed, the TGVs will provide electrical paths all the way through the thickness of the GaN wafer 100.

Figure 26:
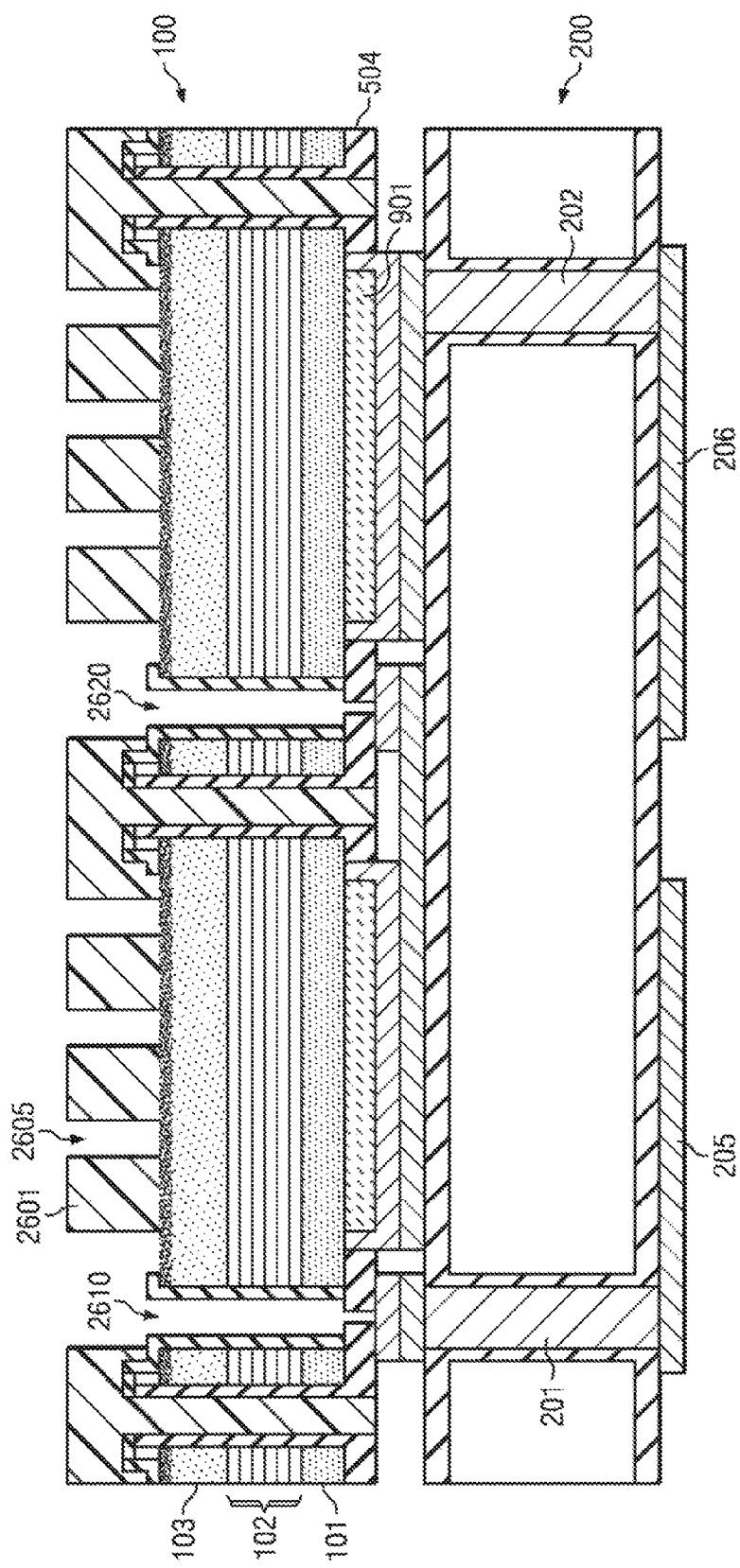

In FIG. 26, seventh photoresist layer 2401 is removed using, e.g., a photoresist stripper. Then, eighth (and final) photoresist layer 2601 is applied to the structure. Photoresist layer 2601 fills in trenches 501-503 but leaves TGVs 2610, 2620 unfilled. Photoresist layer 2601 is patterned so that it defines a metal layout on n-doped layer 103 of wafer 100 and in TGVs 2610, 2620. For instance, opening 2605, and other openings similar to opening 2605, shape metal that is deposited onto GaN material in subsequent steps. FIG. 26 provides a look at the shape of TGV s 2610, 2620 before metal features are implemented therein.

Figure 27:
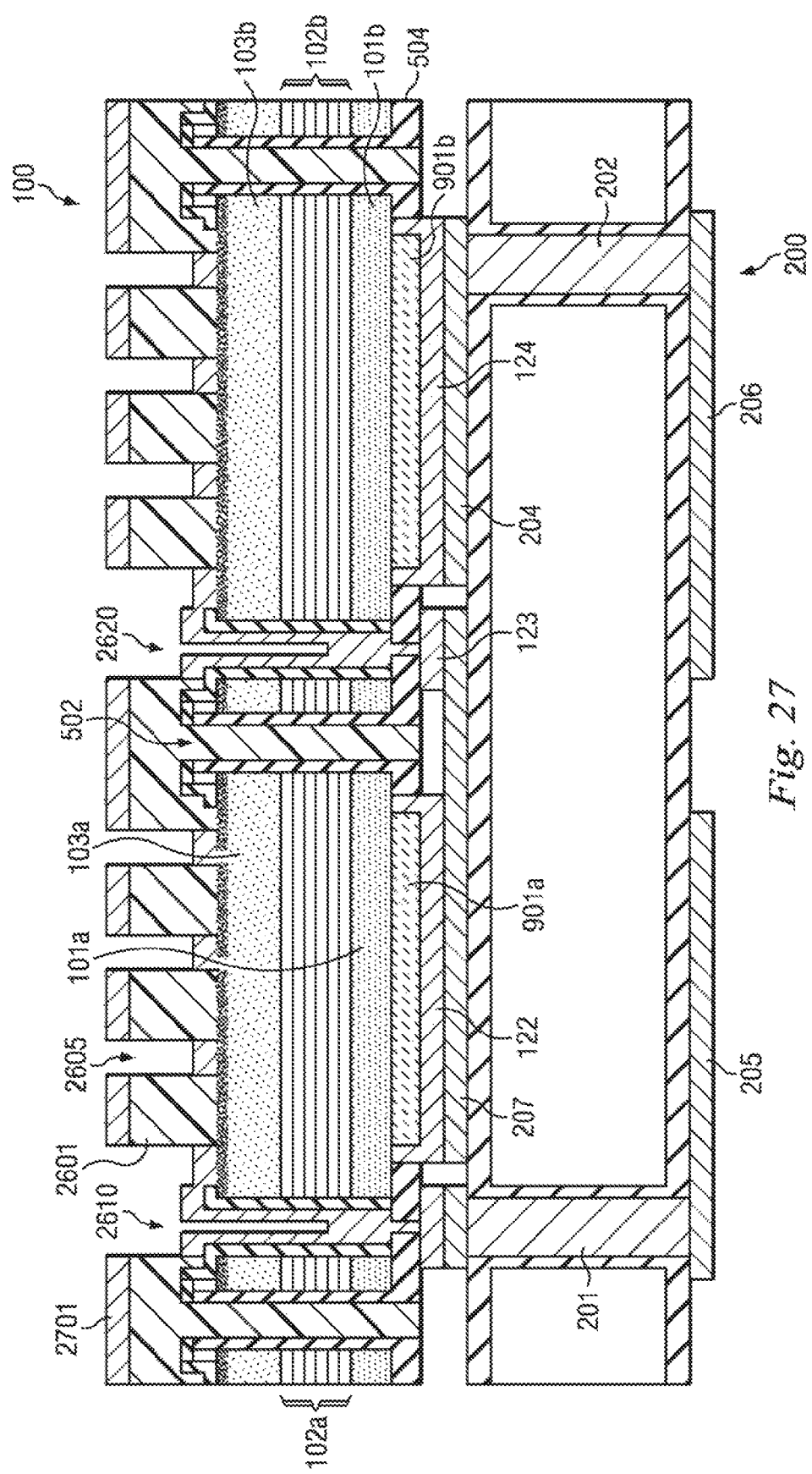

In FIG. 27, metal layer 2701 is applied to the structure over photoresist layer 2601, thereby providing conductive metal in TGVs 2610, 2620 and on the surface of n-doped layer 103. In this example, metal layer 2701 can be made of any of a variety of metals and metals mixtures. One example metal for use in the actions of FIG. 27 includes gold, though other embodiments may use titanium/aluminum or titanium gold mixtures. Further, in this example, the metal layer 2701 may be deposited using a combination of evaporation and electron-beam writing, though any metal application technique now known or later developed can be used in some embodiments.

In FIG. 27, metal 2701 in TGV 2610 provides electrical contact between n-doped layer 103a and via 201. Thus, there is a continuous conductive path from external contact 205 to n-doped layer 103a through TSV 201 and TGV 2610.

On the right-hand side of the die illustrated in FIG. 27, TGV 2620 provides electrical contact between n-doped layer 103b and metal contacts 122, 123, 207. Thus, TGV 2620 provides a conductive path between p-doped layer 101a on the left-hand side of the structure and n-doped layer 103b on the right-hand side of the structure. The LED device of FIG. 27 is a multi junction device, having two quantum well structures (MQWs 102a, 102b) in the path between n-contact 205 and p-contact 206.

Figure 28:
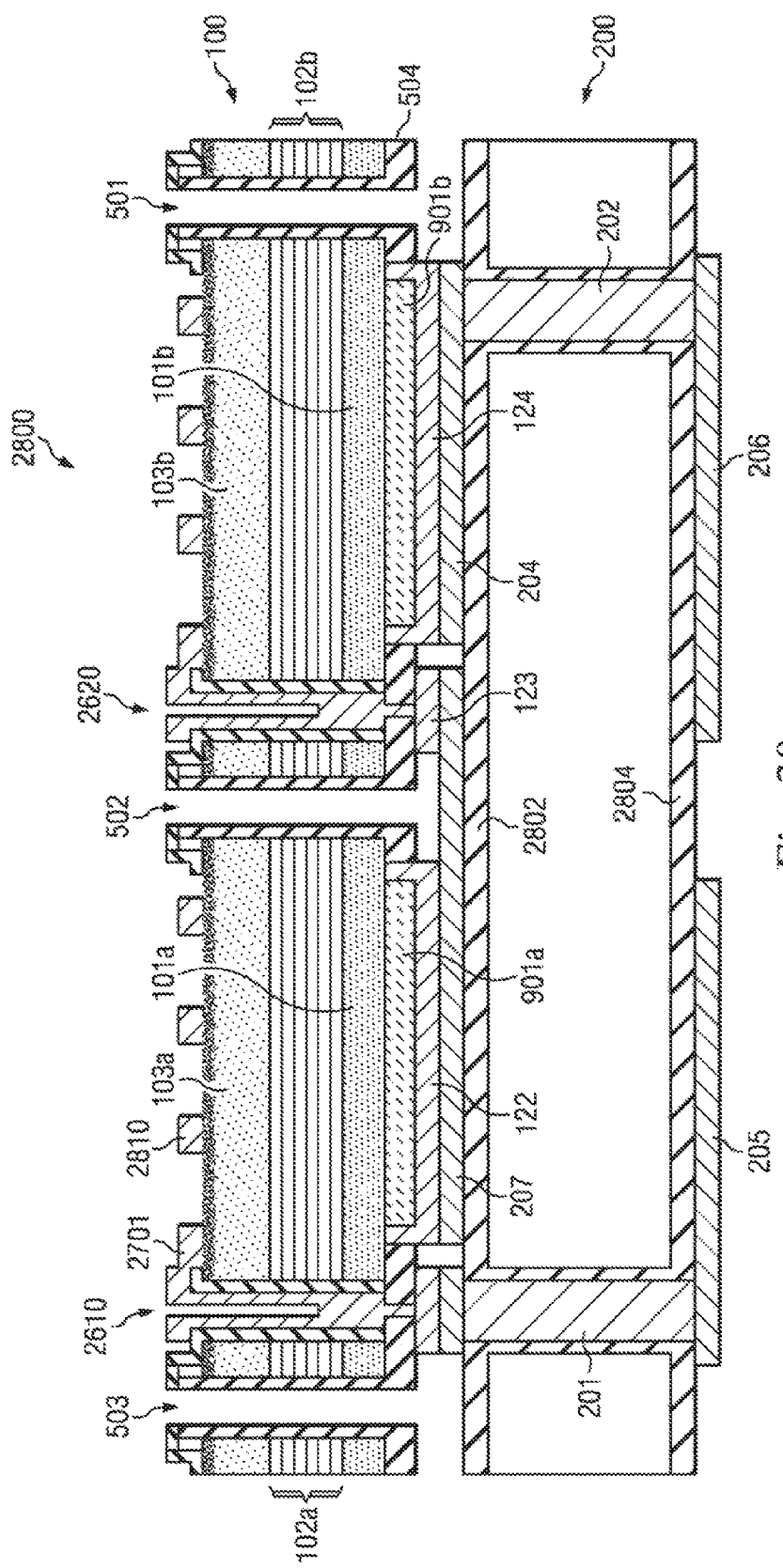

FIG. 28 shows die 2800 after the wafer-level processing steps of the previous figures. In FIG. 28, photoresist layer 2601 is removed using, e.g., a photoresist stripper. The removal of photoresist 2601 also removes portions of metal layer 2701 on top of photoresist layer 2601. The remaining portions of metal layer 2701 are patterned by photoresist layer 2601 to provide metal features in TGVs 2610, 2620 and metal lines (e.g., line 2810) on top of n-doped layer 103a, 103b.

In another aspect, the die 2800 can be thought of as a vertical LED device that has a semi-insulated carrier wafer 200. Carrier wafer 200 has insulation films 2802, 2804 which may be the same or different material. Example materials for insulation films 2802, 2804 include Si, SiN, SiON, or a combination thereof. Of course, such examples are not limiting, as any appropriate insulating film may be used in some embodiments. Films 2802, 2804 may be made by any suitable process, such as CVD. Furthermore, electrical connections through carrier wafer 200 are made by TSVs 201, 202, though the scope of embodiments is not so limited. In another embodiment, a Redistribution Layer (RDL) is used in carrier wafer 200.

It bears mentioning again that the actions shown in FIGS. 1-28 are performed on a wafer level. Subsequent steps may include, among other things, applying a wafer-level phosphor coating and dicing the wafers to separate the individual dies, such as die 2800. In this example, the dicing may be performed at trenches 501, 503 to separate die 2800 from dies (not shown) on either side thereof.

Figure 29:
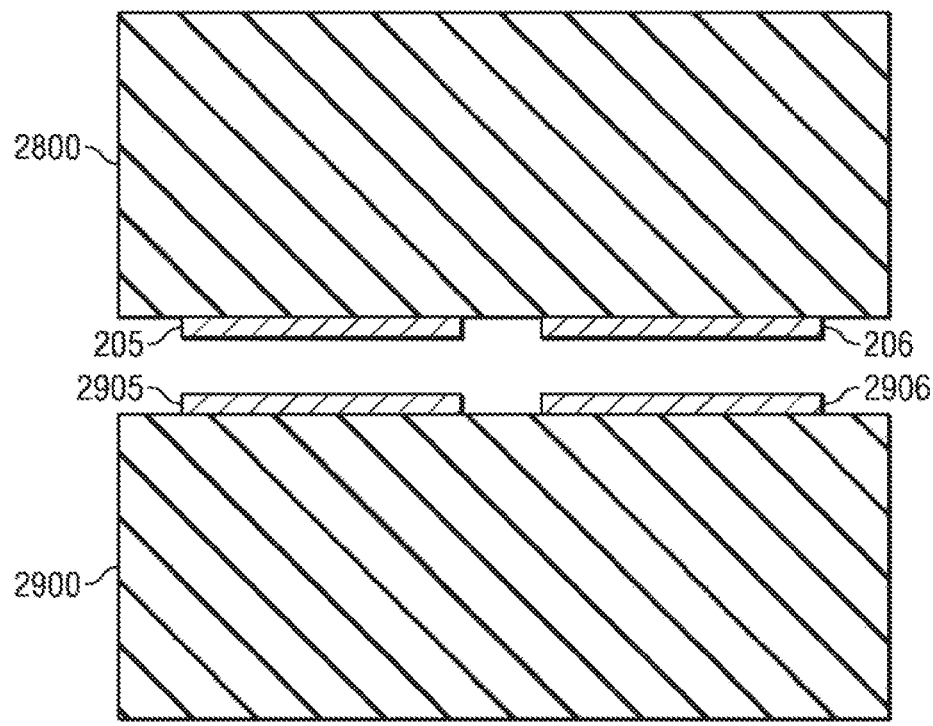
FIG. 29 is an illustration of an example surface mounting process for a die according to one embodiment.

Further steps may also include mounting the die 2800 on a sub-mount, such as another die, in furtherance of creating an LED package. FIG. 29 is a simplified, illustration of die 2800, which can be surface mounted on die 2900. Contact pads 2905, 2906 correspond to respective contact pads 205, 206 of die 2800. Thus, the sub-mount arrangement of FIG. 29 omits bonding wires or flip chip techniques in favor of the contact pads shown. Various embodiments benefit from the omission of bond wires and flip chip structures. For instance, as mentioned above, bond wires are typically seen as wasteful of surface area, since bond wires take up space on the sides of the mounted structure. By contrast, the configuration shown in FIG. 29 uses contact pads underneath die 2800 that are no larger in area than the footprint of die 2800.

Furthermore, whereas flip chip techniques are typically considered complex and expensive on the die level, the contact pads shown in FIG. 29 offer simplicity. For instance, conventional flip chip techniques use vias that contact the outside of the die but do not penetrate the whole way through the wafer, instead using complex internal metal interconnect layers to provide electrical communication. In comparison, the TGV/TSV structure shown in FIG. 28 is relatively simple and omits complex metal interconnect layers.

Figure 30:
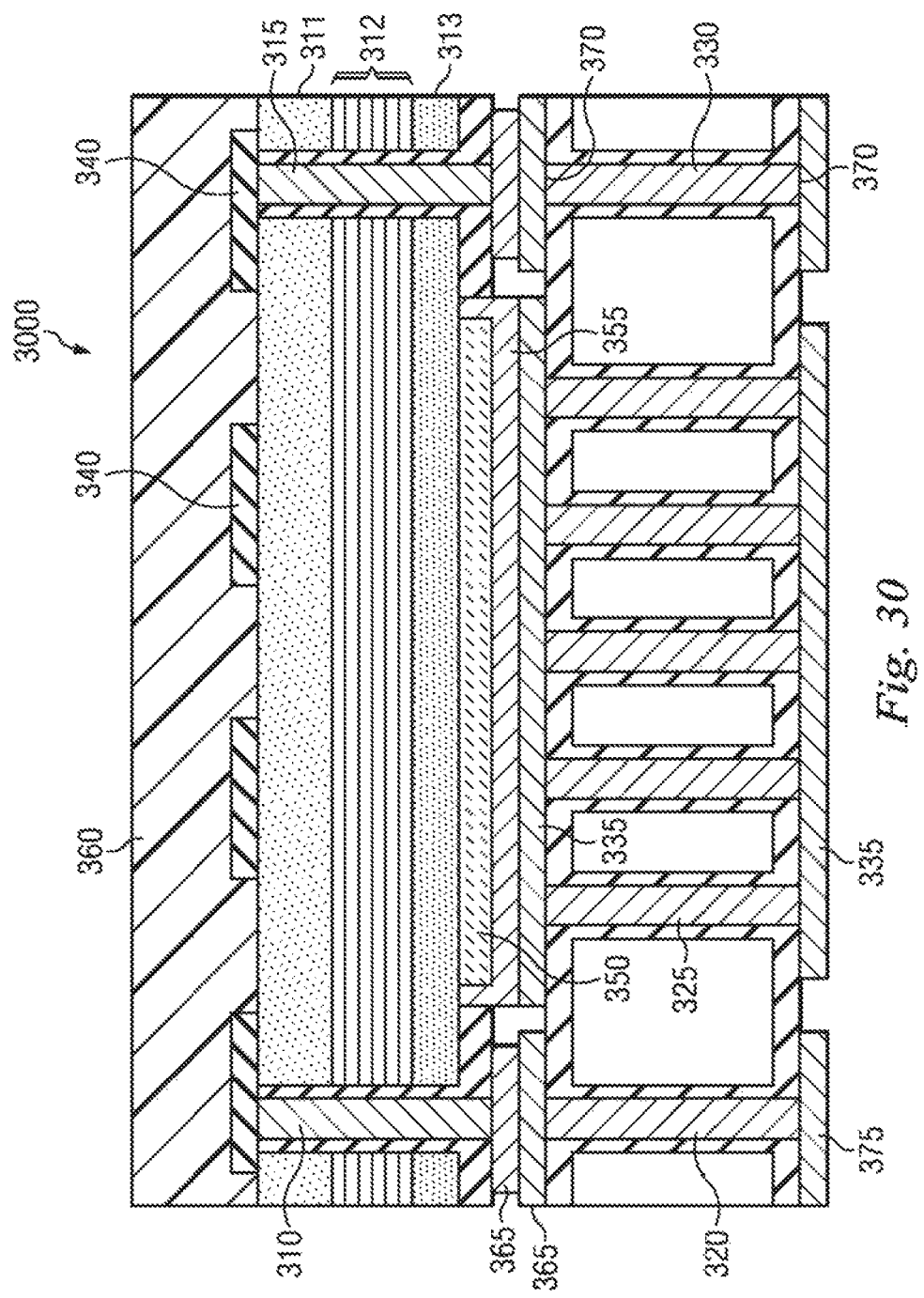
FIG. 30 is an illustration of an example single-junction die according to one embodiment.

The example of FIGS. 1-28 provides a process for making a multi junction die. However, it should be noted that the processes shown can be adapted to manufacture single junction devices as well. FIG. 30 shows an exemplary die 3000, adapted according to embodiments described herein. The example of FIG. 30 shows a GaN epi wafer and a silicon carrier wafer, though the scope of embodiments may include other materials.

LED die 3000 includes TGVs 310, 315 in a GaN wafer that includes n-doped layer 311, MQW structure 312, and p-doped layer 313. TGV 310 provides electrical contact between n-doped layer 311 and bonding pads 365, which are in electrical contact with TSV 320 and external contact pad 375.

Similarly, TGV 315 provides electrical contact between n-doped layer 311 and TSV 330, which has n-contact pads 370 (one of which is an external contact pad). Five TSVs, exemplified by TSV 325, connect contact pads 335 with bonding metal 355, ohmic reflector 350, and p-doped layer 313. N-metal structures 340 are on top of die 340, but may be omitted in some embodiments to provide for a full area transparent conductive layer. Phosphor coating 360 is illustrated in FIG. 30, and it is understood that a similar phosphor coating may be applied to die 2800 of FIG. 28 and die 3600 of FIG. 36.

Just as die 2800 can be surface mounted using its external contact pads, die 300 can also be surface mounted to another die. Vias 310, 315, 320, 325 provide electrical contact through the wafer structures of die 3000 to provide n- and p-contacts on the bottom of die 3000. Such n- and p-contacts minimize the surface area used to mount die 3000, especially when compared to conventional bond wire processes.

The process shown in FIGS. 1-28 is only one process for manufacturing LED devices within the scope of embodiments. Other processes may be implemented as well. FIGS. 31-36 illustrate a similar, though different, process for manufacturing an LED die similar to that shown in FIG. 28. Whereas FIGS. 1-28 illustrate a process in step-by-step detail, FIGS. 31-36 offer excerpts at various steps in the process, and it is understood that the same deposition, etching, patterning, and bonding techniques can be used in the process illustrated in FIGS. 31-36.

Figure 31:
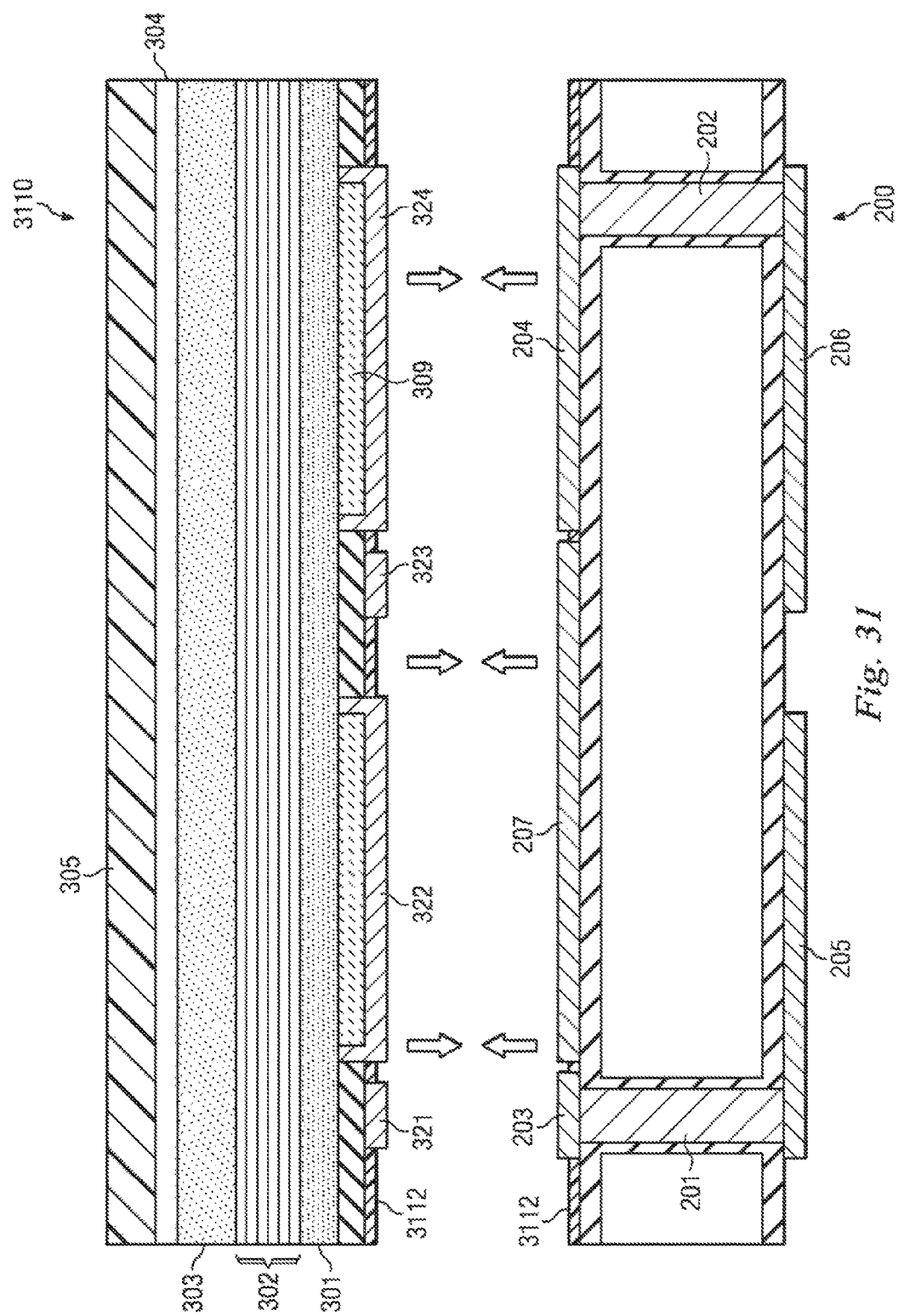
FIGS. 31-36 are cross-sectional illustrations of an example die to illustrate another wafer-level process for manufacturing dies from a wafer-level structure according to one embodiment.

FIG. 31 is a cross-sectional view of a single die during manufacture. As with FIGS. 1-28, it is understood that the processes described are wafer-level processes, and other dies embodied in the same wafers undergo the same processes during the same processing steps. It is also understood that FIGS. 31-36 show a GaN epi wafer and a silicon carrier wafer, but the scope of embodiments may include other materials.

FIG. 31 shows two wafers 3110, 200 during alignment and bonding. Alignment and bonding can be accomplished in the same manner as described above with respect to FIGS. 13 and 14. Wafer 3110 is an epi wafer, similar to wafer 100 of FIG. 13, but with a few noticeable differences. Wafer 3110 includes sapphire wafer 305, un-doped GaN layer 304, n-doped GaN layer 303, MQW structure 302, p-doped layer 301, and p-ohmic reflector layer 309. The bottom surface of wafer 3110 includes metal contact pads 321-324, which may be formed similarly to those shown in FIG. 13. One aspect of note is that wafer 3110 does not include trenches defining the boundary of the die-such trenches are formed in subsequent steps described below. Another aspect of note is the inclusion of polymer 3112, which helps to prevent cracking during bonding. Wafer 200 is substantially the same as wafer 200 of FIG. 13, but with the addition of polymer 3112.

Figure 32:
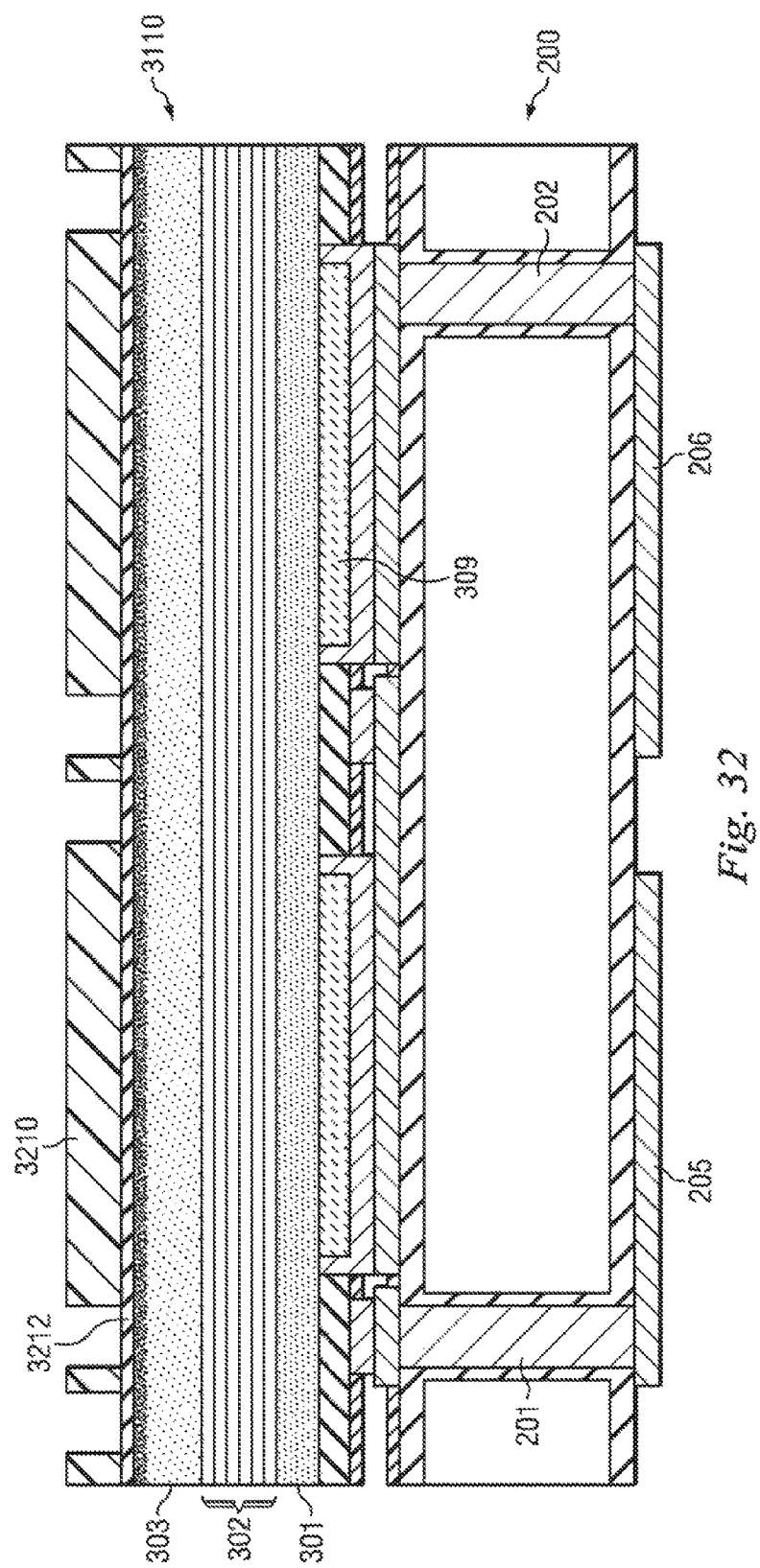

FIG. 32 shows the same die after sapphire wafer 305 and un-doped GaN layer 304 have been removed. Furthermore, n-doped layer 303 has been roughened. Oxide layer 3212 is applied as a hard mask, and photoresist layer 3210 is patterned on to top surface of wafer 3110. Photoresist layer 3110 is patterned so as to define areas for making TGVs in wafer 3110 and also for creating trenches that define the lateral dimension of the die. A two-step etching process that includes reactive ion etching and inductively coupled plasma etching may then use to etch to the bottom of p-doped layer 301. Photoresist layer 3210 and oxide layer 3212 are then removed, and sidewall passivation is performed by forming an additional oxide layer.

Figure 33:
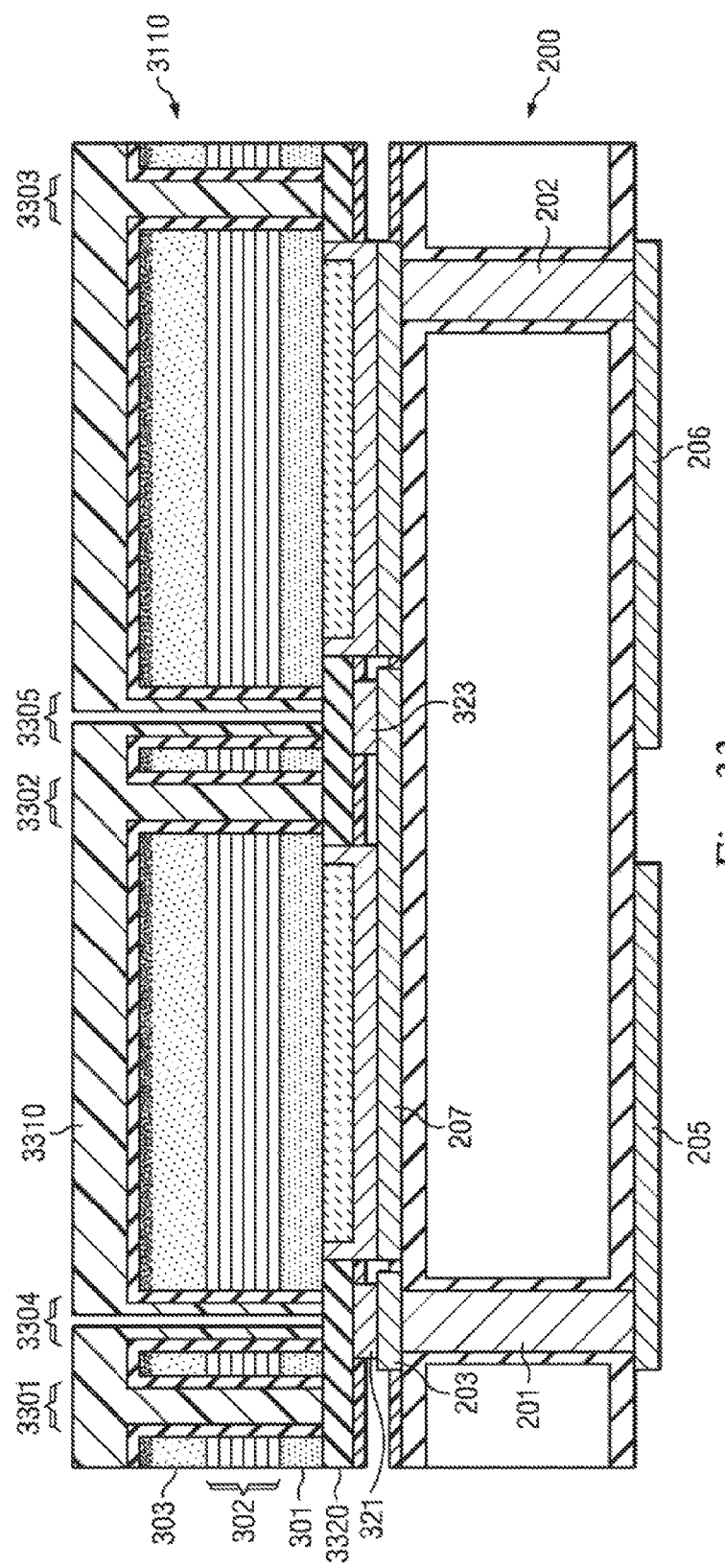

FIG. 33 shows the next photoresist pattern, with photoresist layer 3310 arranged so as to protect trenches 3301-3303. Photoresist layer 3310 also forms lighting areas within TGVs 3304, 3305 to prepare for etching oxide layer 3320. After the subsequent etching step, TGV 3304 will extend down to contact pad 321, and TGV 3305 will extend down to contact pad 323.

Figure 34:
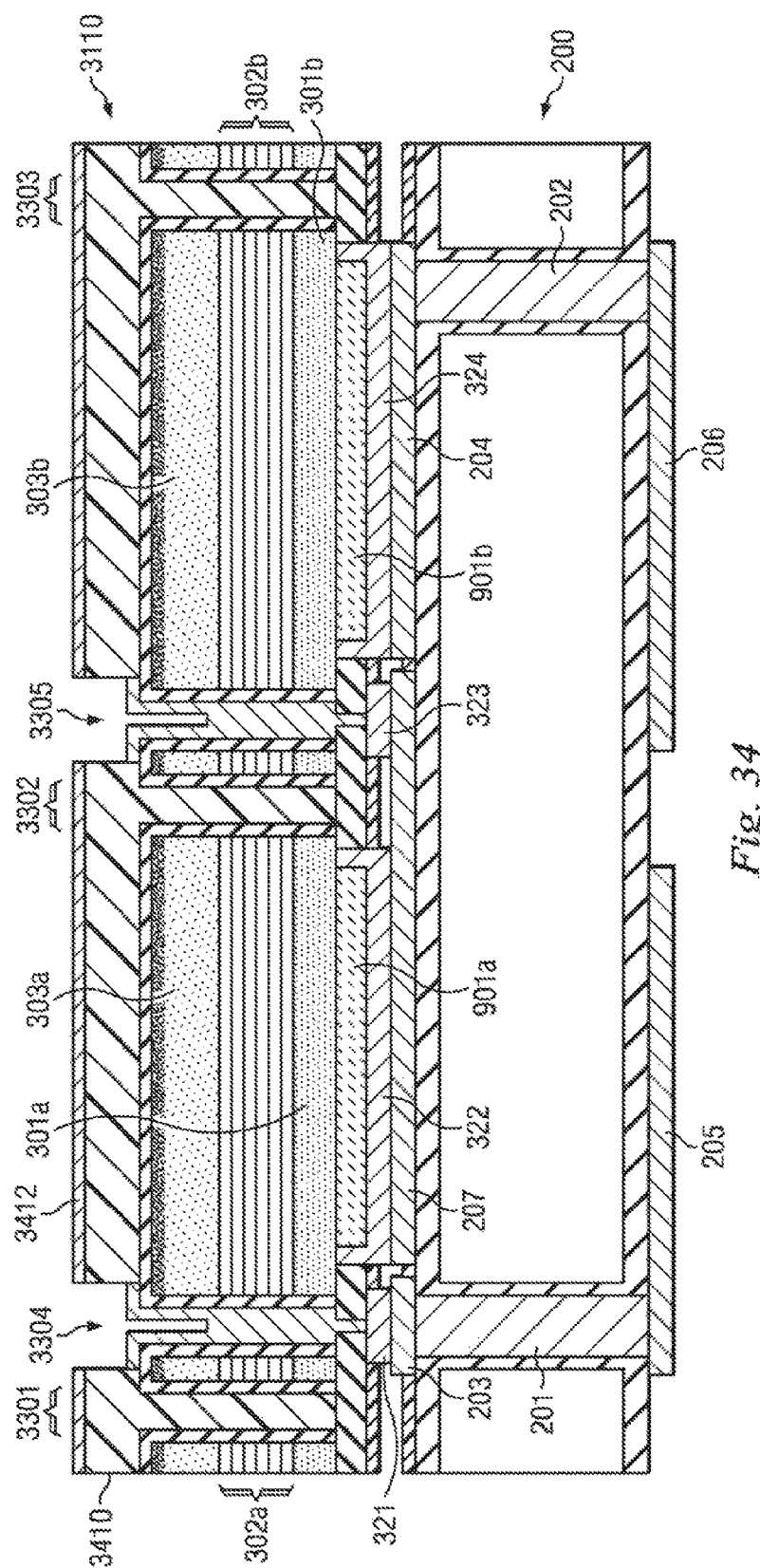

FIG. 34 shows a metal deposition step subsequent to the shaping and defining of TGV s 3304, 3305. Photoresist layer 3310 is stripped and replaced by photoresist layer 3410. Photoresist layer 3410 is patterned so as define the metal application to TGVs 3304, 3305. Metal layer 3412 is then deposited on top of photoresist layer 3410. Metal layer 3412 may include, e.g., a chrome/gold mix, a titanium/aluminum mix, or a titanium/gold mix and may be applied in a manner similar to the TGV metal of the previously-described embodiment.

The metal deposition step at FIG. 34 completes an electrical conductive path from the top of wafer 3110 to the bottom of wafer 200, which includes external contact pads 205, 206. Subsequent steps described below make electrical contact between TGV s 3304, 3305 and respective n-doped layers 303a, 303b to create the electrical conductive path through the device with multiple junctions.

Figure 35:
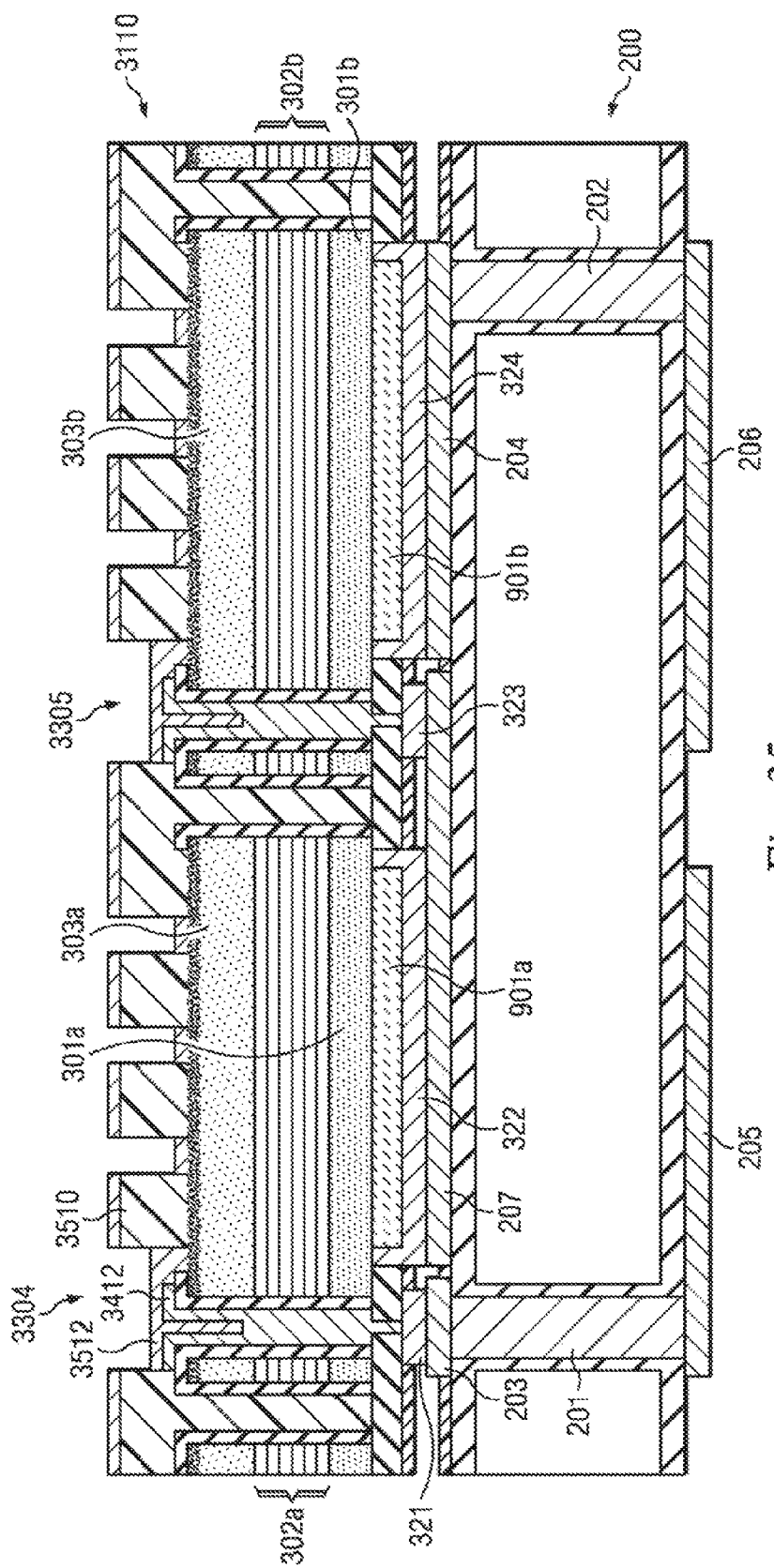

FIG. 35 shows a subsequent step in the manufacturing process of the die. In FIG. 35, photoresist layer 3410 has been removed, and photoresist layer 3510 has been applied to wafer 3110. Further metal layer 3512 is applied over photoresist layer 3510. Metal layer 3512 may be the same as or different from, metal layer 3412 and may include, e.g. a chrome/gold mix, a titanium/aluminum mix, or a titanium/ gold mix. Metal layer 3512 may be applied in a manner similar to the TGV metal of the previously-described embodiment.

After the metal deposition step of FIG. 35, the electrical conductive paths through the die are apparent. N-doped layer 303a is in electrical contact with external contact pad 205 through TGV 3304 and TSV 201. Similarly, p-doped layer 301b is in electrical contact with external contact pad 206 through TSV 202. N-doped layer 303b is in electrical contact with p- doped layer 301a through metal contact pads 322, 207, and 323 and TGV 3305. The die is shown as a multi junction die.

Figure 36:
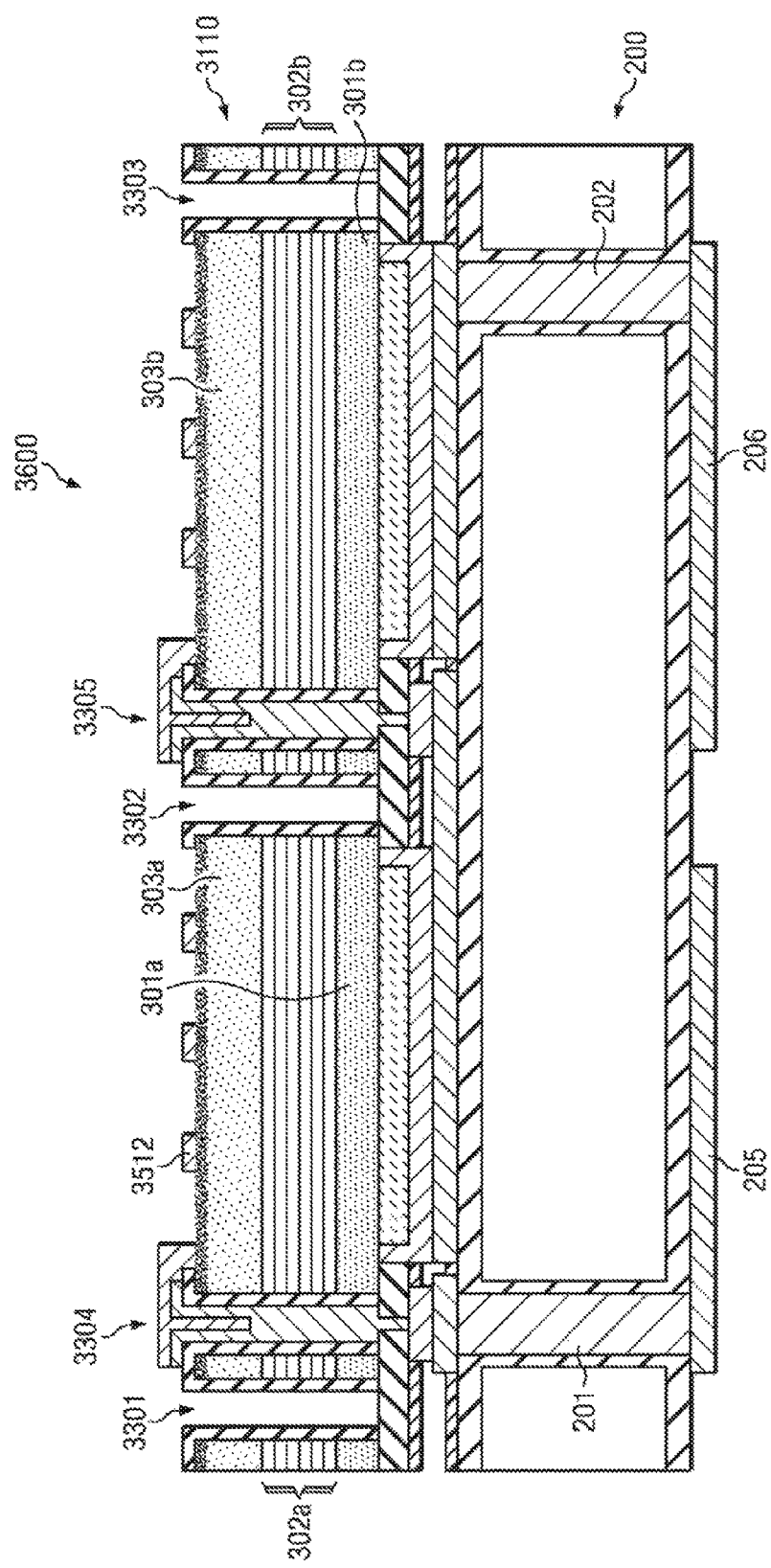

FIG. 36 shows die 3600 after photoresist layer 3510 (and the metal on top of photoresist layer 3510) has been stripped. Trenches 3301-3303 are not filled, and metal layer 3512 has been patterned to cover portions of TGV 3304, 3305 and n-doped layer 303a, 303b. Trench 3302 divides the GaN of die 3600 into two portions, and trenches 3301, 3303 define the lateral boundaries of die 3600. Further processing steps may include applying a wafer-level phosphor coating and dicing the wafers 3110, 200 to separate the individual dies. Each of the individual dies (exemplified by die 3600) may be surface mounted on respective sub-mounts, as shown in FIG. 29.

Figure 37:
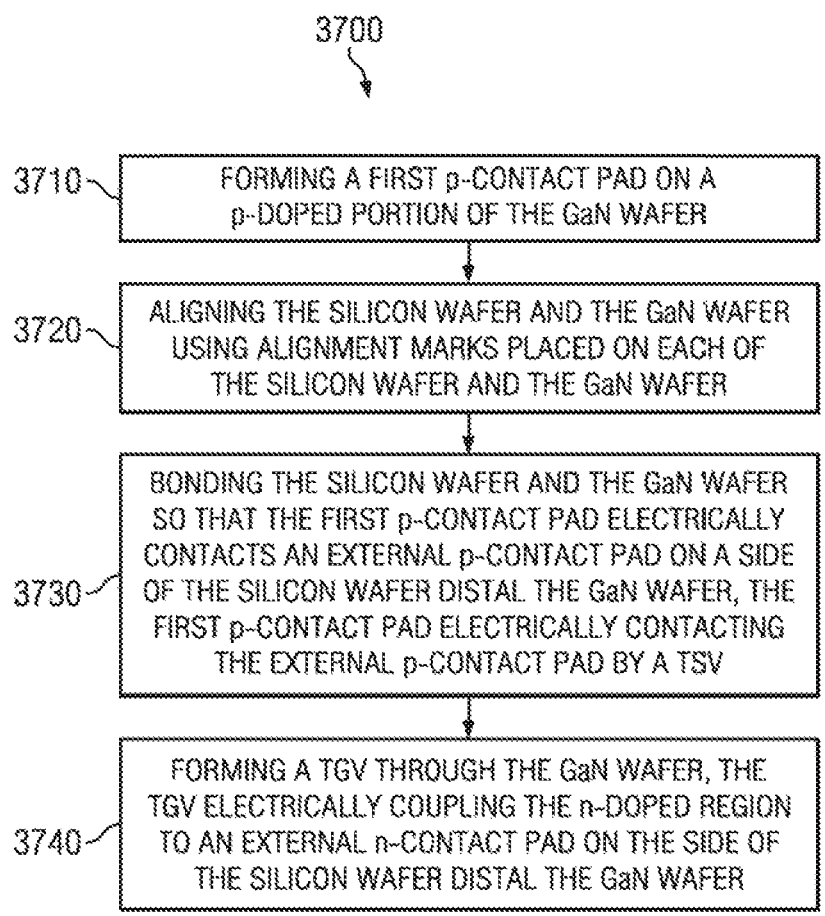
FIG. 37 is an illustration of an exemplary flow according to one embodiment for manufacturing dies.

FIG. 37 is an illustration of exemplary flow 3700, adapted according to one embodiment for manufacturing dies, such as those shown in FIGS. 28, 30, and 36. Flow 3700 is a wafer-level process for manufacturing a semiconductor structure that has an epi wafer coupled to a carrier wafer. The semiconductor structure is processed to produce a plurality of Light Emitting Diode (LED) dies. Process 3700 may be performed by various semiconductor processing tools at one or more facilities. The epi wafer and carrier wafer may be manufactured according to processes now known or later developed. In the following description of FIG. 37, the example provides a GaN epi wafer and a silicon wafer, though, as with the embodiments described above, materials other than GaN and silicon may be used.

In block 3710, a first p-contact pad is formed on a p-doped portion of the GaN wafer. The first p-contact pad is a conductive metal pad that is bonded with a corresponding metal pad on the silicon wafer in a subsequent step. Further contact pads may also be formed as desired for a given application. The GaN wafer also has an n-doped portion and an MQW structure so that the die uses the GaN layers to emit light.

In block 3720, the silicon wafer is aligned with the GaN wafer using alignment marks placed on each of the silicon wafer and the GaN wafer. An example alignment process is shown in FIG. 14.

In block 3730, the silicon wafer and the GaN wafer are bonded so that the first p-contact pad electrically contacts an external p-contact pad on a side of the silicon wafer distal the GaN wafer. The first p-contact pad electrically contacts the second p-contact pad by a TSV. The external p-contact pad utilizes the TSV to electrically communicate with the doped layers in the GaN wafer. An example bonding process is shown in FIGS. 13 and 14.

In block 3740, a TGV is formed through the GaN wafer. The TGV electrically couples the n-doped region to an external n-contact pad on the side of the silicon wafer distal the GaN wafer. In this embodiment, a second TSV may be used to facilitate electrical communication between the TGV and the external n-contact pad.

Thus, in this embodiment, the external n-contact utilizes a TGV and a TSV to make electrical contact with an n-doped layer of the GaN, and the external p-contact pad utilizes a TSV to make electrical contact with the p-doped layer of the GaN. Of course, various embodiments may include other TGV s and TSV s, as shown in the embodiments illustrated in FIGS. 1-36.

The scope of embodiments is not limited to the specific flow shown in FIG. 37. Other embodiments may add, omit, rearrange, or modify one or more actions. For instance, other embodiments may form the TSVs before the alignment and bonding processes are performed. In fact, in some embodiments, the silicon wafer may be pre-manufactured to include external contact pads, TSV s, and contact pads corresponding to contact pads on the GaN wafer. Furthermore, the silicon wafer may be manufactured to include protection circuit having various protection diodes (e.g., Zener p-n or n-p-n diodes) for each of the dies. Particularly, the protection circuit is embedded in the respective die. Embedding protection diodes in the silicon wafer may further increase efficiency by minimizing packaging area on the sub-mount.

Flow 3700 may be used to manufacture single-junction devices (e.g., the device of FIG. 30) and/or may be used to manufacture multi junction devices (e.g., as shown in FIGS. 28 and 36). Moreover, the examples herein show devices that have an n-doped layer on a top of the LED device, and p-doped layer below then-doped layer and adjacent a reflector. However, the scope of embodiments includes devices in which that orientation is switched.

Additional steps may further include applying phosphor, dicing, mounting, and packaging. An example of mounting is shown in FIG. 29, and an example phosphor layer is shown in FIG. 30.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The invention claimed is:

1. A light-emitting device, comprising:
 a first epi-structure having a top surface and a bottom surface opposite to the top surface and comprising:
   a first doped semiconductor layer;
   a second doped semiconductor layer closer to the bottom surface than the first doped semiconductor layer; and
   a light-emitting layer disposed between the first and second doped semiconductor layers;
 a first metal element disposed on the bottom surface, and electrically connected to the second doped semiconductor layer;
 a second metal element disposed on the bottom surface;
 a first through-via extending through the first doped semiconductor layer and the second doped semiconductor layer and electrically connected to the first doped semiconductor layer and the second metal element;
 a conductive element disposed on the top surface in a configuration to expose a portion of the top surface, and electrically connected to the first through-via; and
 a phosphor layer disposed on the top surface and covering the conductive element.

2. The light-emitting device of claim 1, wherein the conductive element comprises a plurality of conductive lines.

3. The light-emitting device of claim 1, wherein the conductive element comprises a transparent conductive material.

4. The light-emitting device of claim 1, wherein the first doped conductive layer comprises a roughened surface.

5. The light-emitting device of claim 1, wherein the second metal element is directly arranged under the first through-via.

6. The light-emitting device of claim 1, wherein the first epi-structure and the phosphor layer are directly connected with each other.

7. The light-emitting device of claim 1, wherein first epi-structure further comprises a side surface between the top surface and the bottom surface and devoid of the phosphor layer.

8. The light-emitting device of claim 1, further comprising a reflector disposed between the second doped semiconductor layer and the first metal element.

9. The light-emitting device of claim 1, further comprising a substrate, the substrate having an upper surface facing to the bottom surface, a first conductive pad, and a second conductive pad, wherein the first conductive pad and the second conductive pad are disposed on the upper surface.

10. The light-emitting device of claim 9, wherein the first conductive pad is electrically connected to the first metal element.

11. The light-emitting device of claim 9, wherein the first epi-structure and the substrate are directly connected with each other.

12. The light-emitting device of claim 9, wherein the substrate comprises a material of silicon.

13. The light-emitting device of claim 1, further comprising a second epi-structure electrically connected to the first epi-structure.

14. The light-emitting device of claim 13, further comprising a trench separating the first epi-structure and the second epi-structure.

15. The light-emitting device of claim 13, wherein the second epi-structure comprises a third doped semiconductor layer, and a fourth doped semiconductor layer having a different type of conductivity from the third doped semiconductor layer.

16. The light-emitting device of claim 15, wherein the second epi-structure further comprises a third metal element electrically connected to the third doped semiconductor layer.

17. The light-emitting device of claim 15, wherein the first doped semiconductor layer and the third doped semiconductor layer have the same type of conductivity.

18. The light-emitting device of claim 15, further comprising a second through-via extending through the third doped semiconductor layer and the fourth doped semiconductor layer.

19. The light-emitting device of claim 18, wherein the second through-via is electrically connected to the third doped semiconductor layer and the third metal element.

* * * * *